US009799671B2

(12) United States Patent
Pachamuthu et al.

(10) Patent No.: US 9,799,671 B2
(45) Date of Patent: Oct. 24, 2017

(54) THREE-DIMENSIONAL INTEGRATION SCHEMES FOR REDUCING FLUORINE-INDUCED ELECTRICAL SHORTS

(71) Applicant: SANDISK TECHNOLOGIES INC., Plano, TX (US)

(72) Inventors: Jayavel Pachamuthu, San Jose, CA (US); Matthias Baenninger, Menlo Park, CA (US); Stephen Shi, Milpitas, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/680,414

(22) Filed: Apr. 7, 2015

(65) Prior Publication Data
US 2016/0300848 A1 Oct. 13, 2016

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/28273* (2013.01); *H01L 21/28282* (2013.01);
(Continued)

(58) Field of Classification Search
CPC .......... H01L 27/1157; H01L 27/11524; H01L 27/11556; H01L 27/11582;
(Continued)

(56) References Cited

U.S. PATENT DOCUMENTS 5,915,167 A   6/1999  Leedy
5,985,753 A   11/1999 Yu et al.
(Continued)

FOREIGN PATENT DOCUMENTS

KR   10-2009-0001377 A   1/2009
WO   WO 02/15277 A2       2/2002

OTHER PUBLICATIONS

Jang et al., "Vertical Cell Array Using TCAT (Terabit Cell Array Transistor) Technology for Ultra High Density Nand Flash Memory," 2009 Symposium on VLSI Technology Digest of Technical Papers, pp. 192-193.
(Continued)

*Primary Examiner* — Robert Huber
*Assistant Examiner* — Gardner W Swan
(74) *Attorney, Agent, or Firm* — The Marbury Law Group PLLC

(57) ABSTRACT

Dielectric degradation and electrical shorts due to fluorine radical generation from metallic electrically conductive lines in a three-dimensional memory device can be reduced by forming composite electrically conductive layers and/or using of a metal oxide material for an insulating spacer for backside contact trenches. Each composite electrically conductive layer includes a doped semiconductor material portion in proximity to memory stack structures and a metallic material portion in proximity to a backside contact trench. Fluorine generated from the metallic material layers can escape readily through the backside contact trench. The semiconductor material portions can reduce mechanical stress. Alternatively or additionally, a dielectric metal oxide can be employed as an insulating spacer on the sidewalls of the backside contact trench, thereby blocking a diffusion path for fluorine radicals generated from the metallic material of the electrically conductive layers, and preventing
(Continued)

electrical shorts between electrically conductive layers and/or a backside contact via structure.

7 Claims, 22 Drawing Sheets

(51) Int. Cl.
    *H01L 27/11524* (2017.01)
    *H01L 27/11556* (2017.01)
    *H01L 27/1157* (2017.01)
    *H01L 21/28* (2006.01)
    *H01L 21/768* (2006.01)
    *H01L 23/522* (2006.01)
    *H01L 23/528* (2006.01)
    *H01L 29/788* (2006.01)

(52) U.S. Cl.
    CPC .......... *H01L 21/768* (2013.01); *H01L 23/528* (2013.01); *H01L 23/5226* (2013.01); *H01L 27/1157* (2013.01); *H01L 27/11524* (2013.01); *H01L 27/11556* (2013.01); *H01L 29/7883* (2013.01)

(58) Field of Classification Search
    CPC ......... H01L 21/28273; H01L 21/28282; H01L 21/768; H01L 23/5226; H01L 23/528; H01L 29/7883
    See application file for complete search history.

(56) References Cited

U.S. PATENT DOCUMENTS

| | | | |
|---|---|---|---|
| 6,953,697 B1 | 10/2005 | Castle et al. | |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,349,681 B2 | 1/2013 | Alsmeier et al. | |
| 8,445,347 B2 | 5/2013 | Alsmeier | |
| 8,614,126 B1 | 12/2013 | Lee et al. | |
| 8,828,884 B2 | 9/2014 | Lee et al. | |
| 8,884,357 B2 | 11/2014 | Wang et al. | |
| 8,987,089 B1 | 3/2015 | Pachamuthu et al. | |
| 2001/0046727 A1* | 11/2001 | Lin .................. | H01L 21/28114 438/142 |
| 2002/0168849 A1 | 11/2002 | Lee et al. | |
| 2005/0073022 A1* | 4/2005 | Karlsson .......... | H01L 21/76264 257/510 |
| 2006/0068592 A1 | 3/2006 | Dostalik | |
| 2007/0210338 A1 | 9/2007 | Orlowski | |
| 2007/0252201 A1 | 11/2007 | Kito et al. | |
| 2008/0258308 A1 | 10/2008 | Liu et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1* | 6/2010 | Kim .................. | H01L 27/11548 257/316 |
| 2010/0155818 A1 | 6/2010 | Cho | |
| 2010/0181610 A1 | 7/2010 | Kim et al. | |
| 2010/0207185 A1* | 8/2010 | Lee .................. | H01L 21/28282 257/314 |
| 2010/0207195 A1 | 8/2010 | Fukuzumi et al. | |
| 2010/0320528 A1 | 12/2010 | Jeong et al. | |
| 2010/0323514 A1* | 12/2010 | Isobayashi ........ | H01L 21/76807 438/618 |
| 2011/0018052 A1 | 1/2011 | Fujiwara et al. | |
| 2011/0031547 A1 | 2/2011 | Watanabe | |
| 2011/0065270 A1 | 3/2011 | Shim et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2011/0287612 A1 | 11/2011 | Lee et al. | |
| 2011/0291177 A1 | 12/2011 | Lee et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0001252 A1 | 1/2012 | Alsmeier et al. | |
| 2012/0034785 A1 | 2/2012 | Hayashi et al. | |
| 2012/0146122 A1* | 6/2012 | Whang ............... | H01L 29/7889 257/315 |
| 2012/0146127 A1 | 6/2012 | Lee et al. | |
| 2012/0146422 A1 | 6/2012 | Meehi et al. | |
| 2012/0199897 A1 | 8/2012 | Chang et al. | |
| 2012/0256247 A1 | 10/2012 | Alsmeier | |
| 2012/0276719 A1 | 11/2012 | Han et al. | |
| 2013/0069139 A1 | 3/2013 | Ishihara et al. | |
| 2013/0069140 A1 | 3/2013 | Ichinose et al. | |
| 2013/0214344 A1 | 8/2013 | Lim et al. | |
| 2013/0264631 A1 | 10/2013 | Alsmeier | |
| 2014/0070300 A1* | 3/2014 | Jang ................. | H01L 27/11565 257/324 |
| 2014/0225181 A1 | 8/2014 | Makala et al. | |
| 2015/0008503 A1 | 1/2015 | Makala et al. | |
| 2015/0008505 A1 | 1/2015 | Chien et al. | |
| 2015/0076585 A1 | 3/2015 | Pachamuthu et al. | |
| 2015/0079742 A1 | 3/2015 | Pachamuthu et al. | |
| 2016/0049423 A1* | 2/2016 | Yoo .................. | H01L 27/11582 257/324 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

Geil et al., "Etch Resistance of Focused-Ion-Beam-Implanted $SiO_2$," LEOS 1991: Summer Topical Meetings on Epitaxial Materials and In-situ Processing for Optoelectronic Devices, Jul. 29-31, 1991 and Microfabrication for Photonics and Optoelectronics, Jul. 31-Aug. 2, 1991.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

Qian et al., "Fabrication of Si Microstructures Using Focused Ion Beam Implantation and Reactive Ion Etching," 2008 J. Micromech. Microeng. 18, 035003, 5pgs.

Sievila et al., "The Fabrication of Silicon Nanostructures by Focused-Ion-Beam Implantation and TMAH Wet Etching," 2010 Nanotechnology, 21, 145301, 6pgs.

(56) References Cited

OTHER PUBLICATIONS

Chekurov et al., "The Fabrication of Silicon Nanostructures by Local Gallium Implantation and Cryogenic Deep Reactive Ion Etching," 2009 Nanotechnology, 20, 065307, 5pgs.
Invitation to Pay Additional Fees, International Application No. PCT/US2013/049758, dated Oct. 10, 2013, 6pgs.
International Search Report and Written Opinion received in connection with international application No. PCT/US2014/044833; mailed Oct. 2, 2014.
International Search Report and Written Opinion for PCT/US2014/053055, mailed Mar. 27, 2015.
Invitation to Pay Additional fees for PCT/US2014/053055, mailed Dec. 4, 2014.
Ooshita, J. "Toshiba Announces 32Gb 3D-Stacked Multi-Level NAND Flash," Tech & Industry Analysis from Asia, Nikkei Business Publications, 3 pages, (2012).
Whang, S-J, et al., "Novel 3-Dimensional Dual Control-Gate with Surrounding Floating-Gate (DC-SF) NAND Flash Cell for 1Tb File Storage Application," IEDM10-671, pp. 29.7.1-29.7.4, (2010).
Wang, W. et al., "Low Temperature Silicon Selective Epitaxial Growth(SEG) and Phosphorous Doping in a Reduced-Pressure Pancake Reactor," ECE Technical Reports, Purdue University, 107 pages, (1992).
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 13/544,328, filed Jul. 9, 2012, SanDisk Technologies Inc.
U.S. Appl. No. 13/754,293, filed Jan. 30, 2013, SanDisk Technologies Inc.
U.S. Appl. No. 13/933,236, filed Jul. 2, 2013, SanDisk Technologies Inc.
U.S. Appl. No. 14/341,079, filed Jul. 25, 2014, SanDisk Technologies Inc.
U.S. Appl. No. 62/004,990, filed May 30, 2014, SanDisk Technologies Inc.
U.S. Appl. No. 14/530,220, filed Oct. 31, 2014, SanDisk Technologies Inc.
U.S. Appl. No. 14/540,479, filed Nov. 13, 2014, SanDisk Technologies Inc.
The International Search Report and Written Opinion of the International Searching Authority for International Application No. PCT/US2016/0024784, mailed Aug. 24, 2016, 18 Pages.
Invitation to Pay Additional Fees, and Communication Relating to the Results of the Partial International Search for International Application No. PCT/US2016/0024784, mailed Jun. 20, 2016, 9 Pages.

\* cited by examiner

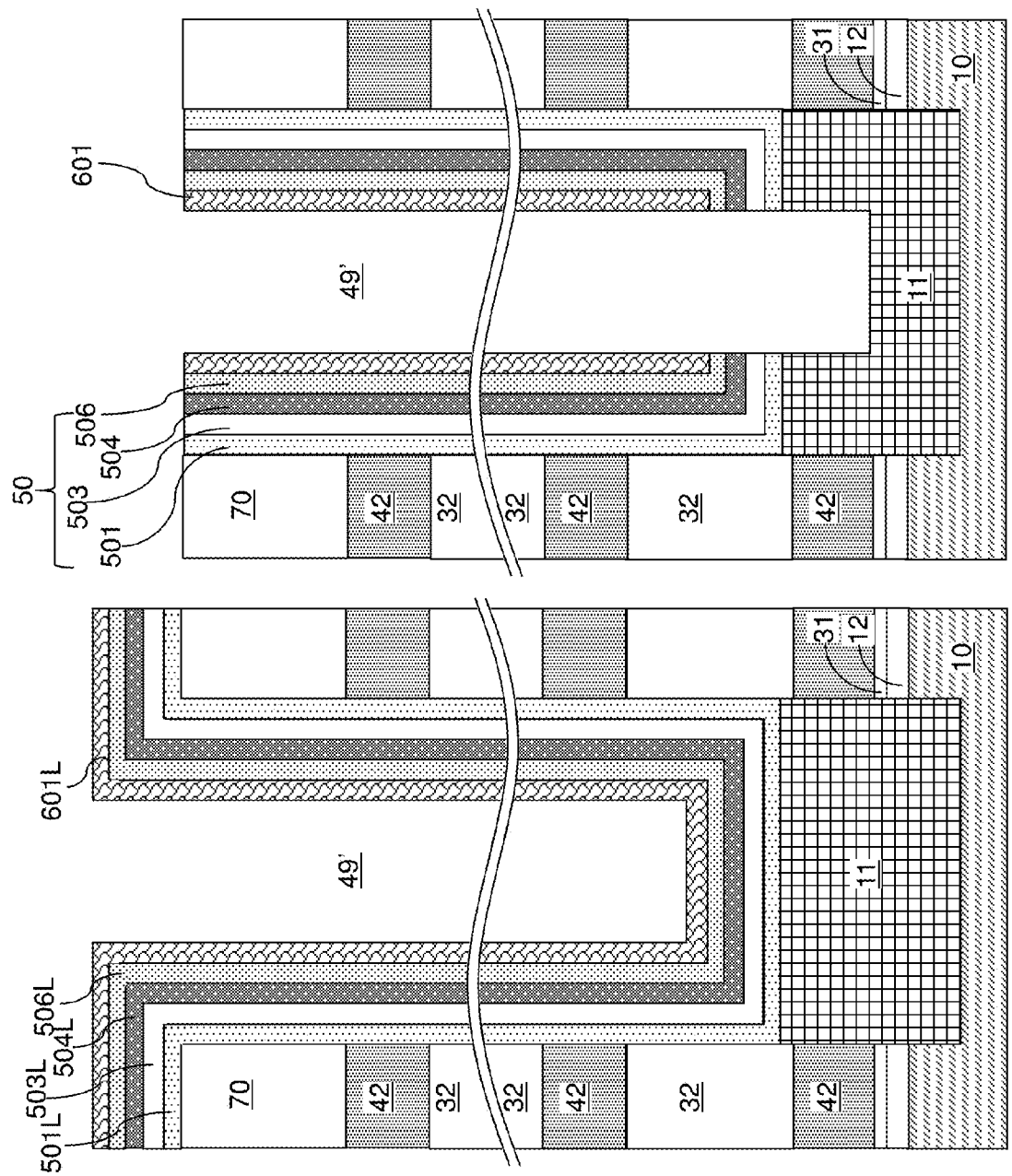

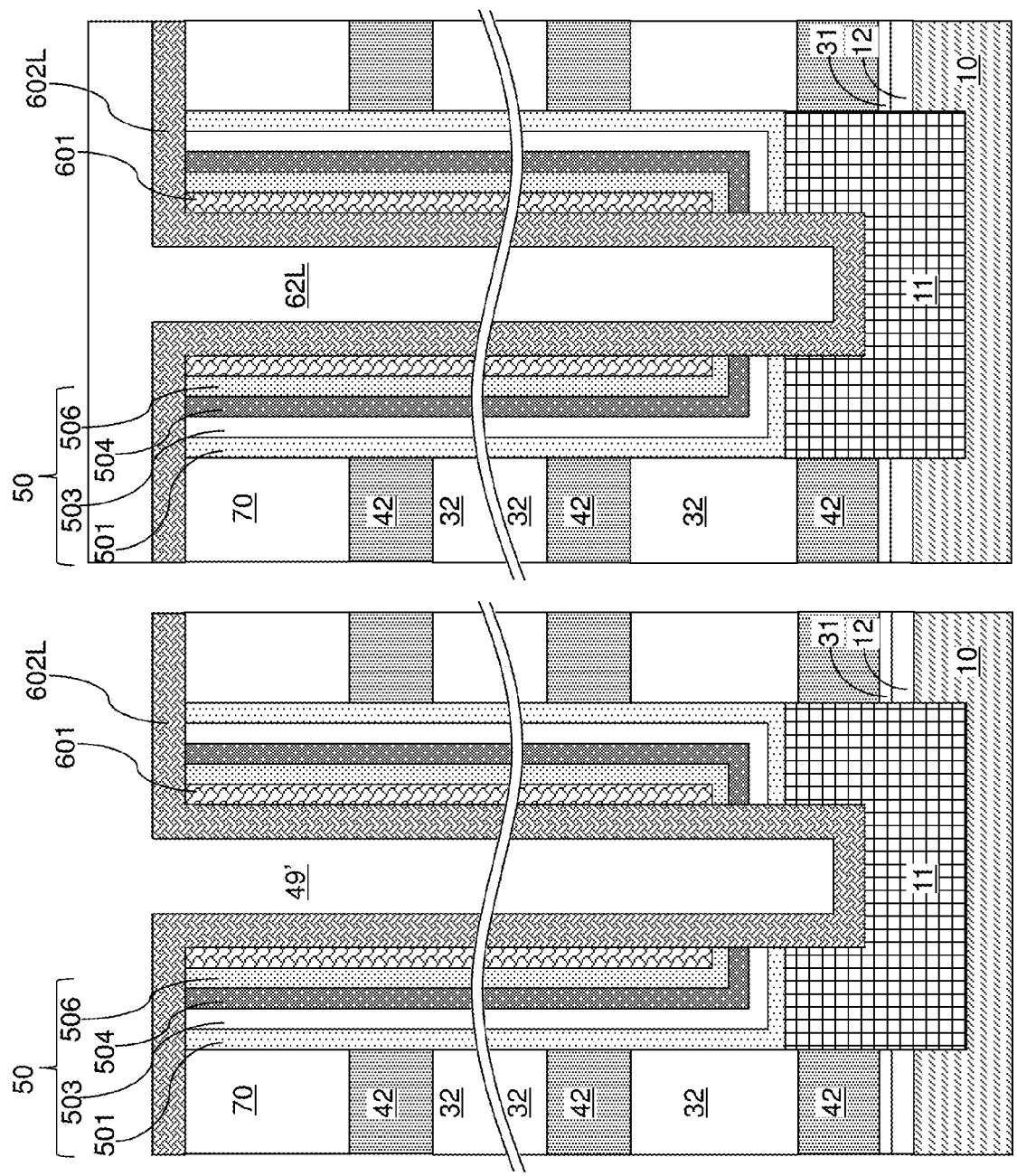

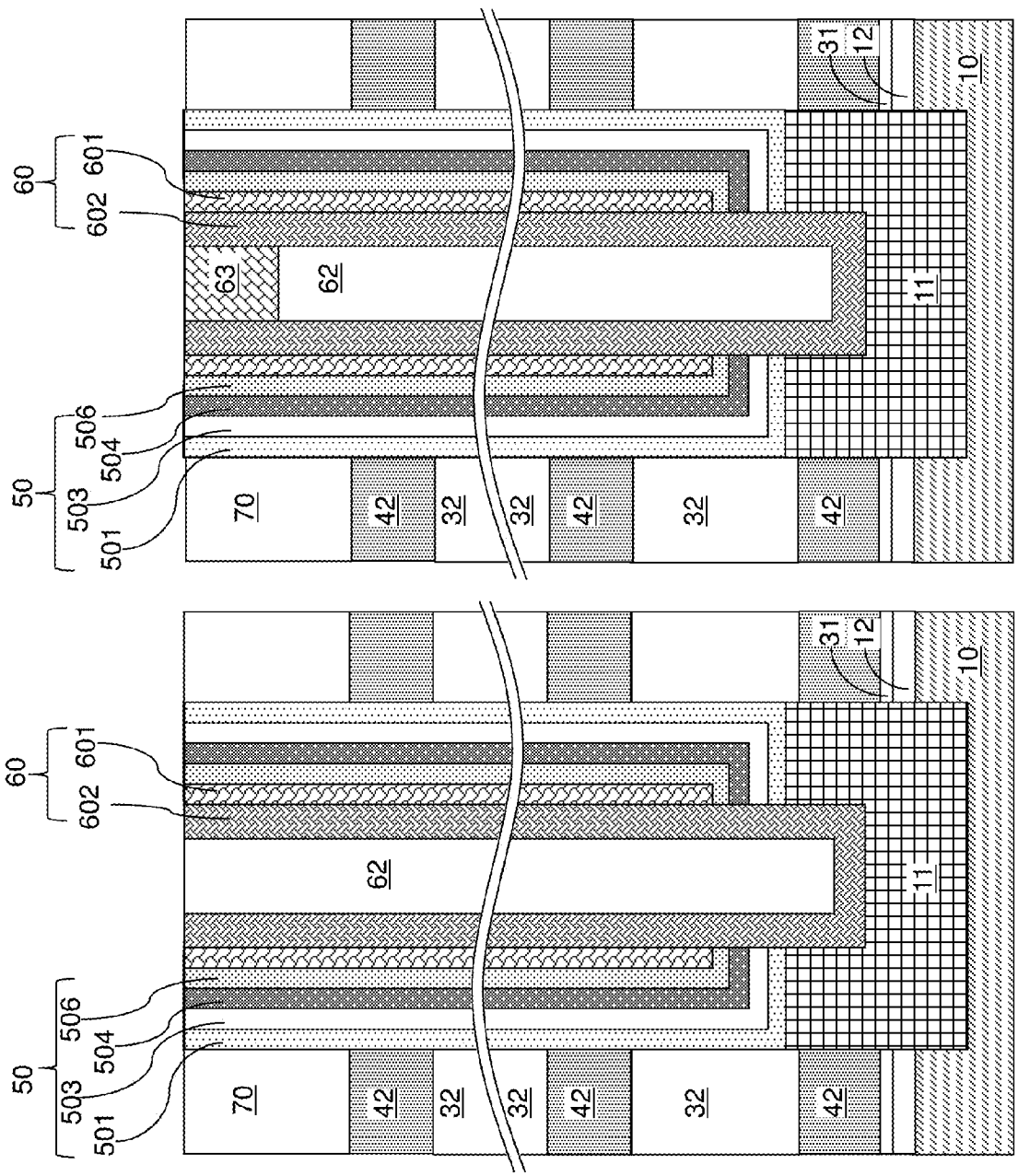

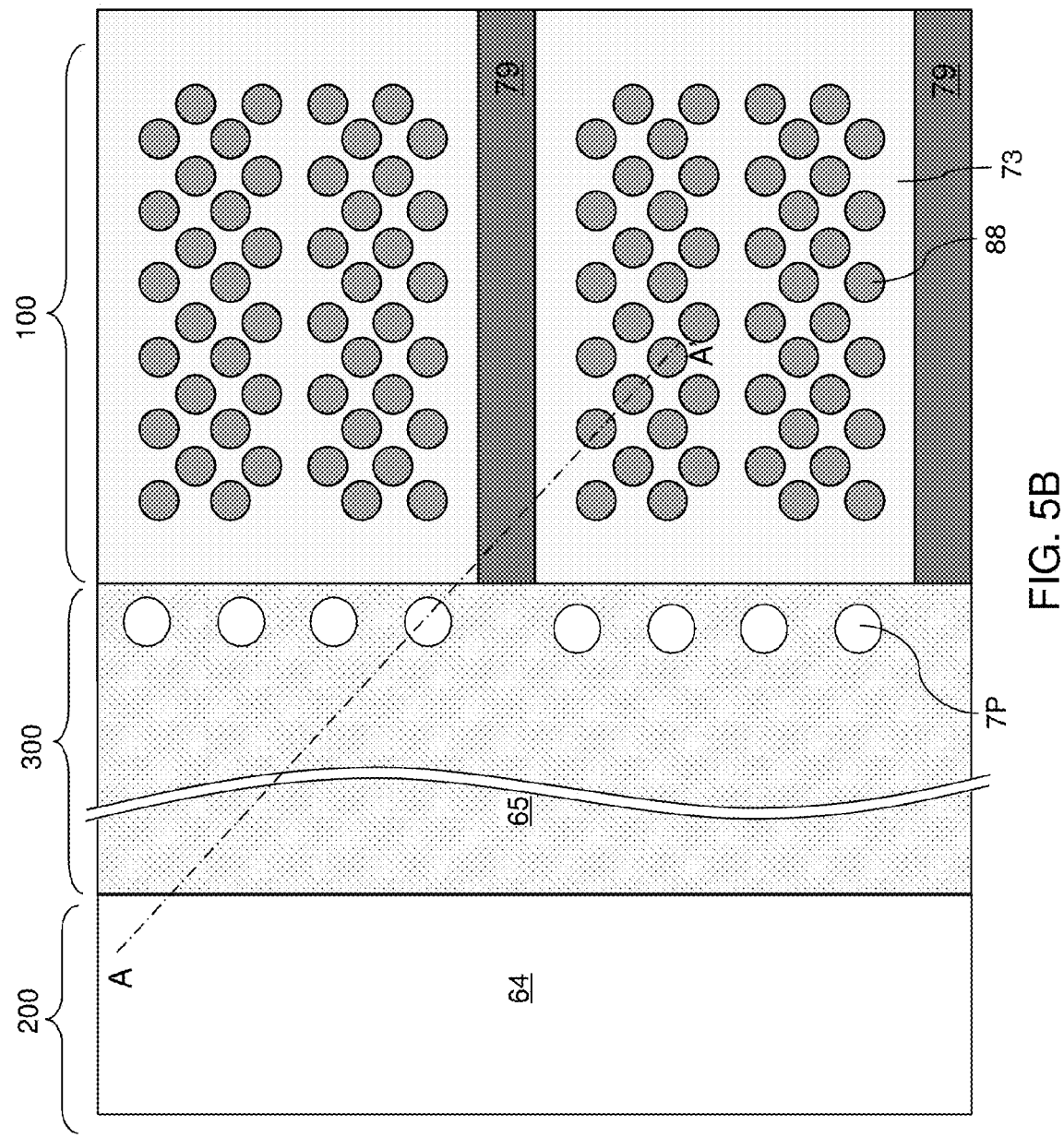

US 9,799,671 B2

THREE-DIMENSIONAL INTEGRATION SCHEMES FOR REDUCING FLUORINE-INDUCED ELECTRICAL SHORTS

FIELD

The present disclosure relates generally to the field of semiconductor devices and specifically to metal interconnect structures for providing electrical connection to three-dimensional semiconductor devices, such as vertical NAND strings, and methods of making thereof.

BACKGROUND

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. For example, a 3D NAND stacked memory device may include a high density of bit lines electrically connected to respective drain regions through underlying contact via structures. Misalignment between the contact via structures and the bit lines can cause undesirable electrical shorts or electrical opens.

SUMMARY

According to an aspect of the present disclosure, a monolithic three-dimensional memory device is provided, which includes a stack of alternating layers comprising insulating layers and electrically conductive layers and located over a substrate; an array of memory openings extending through the stack; and a plurality of memory stack structures located within a respective memory opening. The electrically conductive layers comprise composite electrically conductive layers. Each composite electrically conductive layer comprises: a doped semiconductor material portion; and a metallic material portion electrically shorted to the doped semiconductor material portion and laterally spaced from a most proximal memory stack structure by at least the doped semiconductor material portion.

According to another aspect of the present disclosure, a monolithic three-dimensional memory device is provided, which comprises: a stack of alternating layers comprising insulating layers and electrically conductive layers and located over a substrate; an array of memory openings extending through the stack; a plurality of memory stack structures located within a respective memory opening; a backside contact via structure extending through the stack; and an insulating spacer laterally surrounding the backside contact via structure and comprising a dielectric metal oxide.

According to yet another aspect of the present disclosure, a method of manufacturing a memory device is provided. A stack of alternating layers comprising insulating layers and sacrificial material layers is formed over a substrate. A plurality of memory openings is formed through the stack. Memory stack structures are formed in the plurality of memory openings. The sacrificial material layers are replaced with electrically conductive layers. The electrically conductive layers comprise composite electrically conductive layers. Each composite electrically conductive layer comprises: a doped semiconductor material portion; and a metallic material portion electrically shorted to the doped semiconductor material portion and laterally spaced from a most proximal memory stack structure by at least the doped semiconductor material portion.

According to still another aspect of the present disclosure, a method of manufacturing a memory device is provided. A combination of a stack of alternating layers and a plurality of memory stack structures extending through the stack is formed over a substrate. The alternating layers comprise insulating layers and electrically conductive layers. A backside contact trench is formed through the stack to a top surface of the substrate. An insulating material layer comprising a dielectric metal oxide is deposited in the backside contact trench and over the stack. An insulating spacer is formed in the backside contact trench by anisotropically etching the insulating material layer. A backside contact via structure electrically shorted to a portion of the substrate is formed through the insulating spacer and within the backside contact trench.

BRIEF DESCRIPTION OF THE DRAWINGS

FIGS. 2A-2F are sequential vertical cross-sectional views of a memory opening within the first exemplary structure during various processing steps employed to form a memory stack structure according to the first embodiment of the present disclosure.

FIG. 5B is a partial see-through top-down view of the first exemplary structure of FIG. 5A. The vertical plane A-A' is the plane of the vertical cross-sectional view of FIG. 5A.

DETAILED DESCRIPTION

Figure 1:
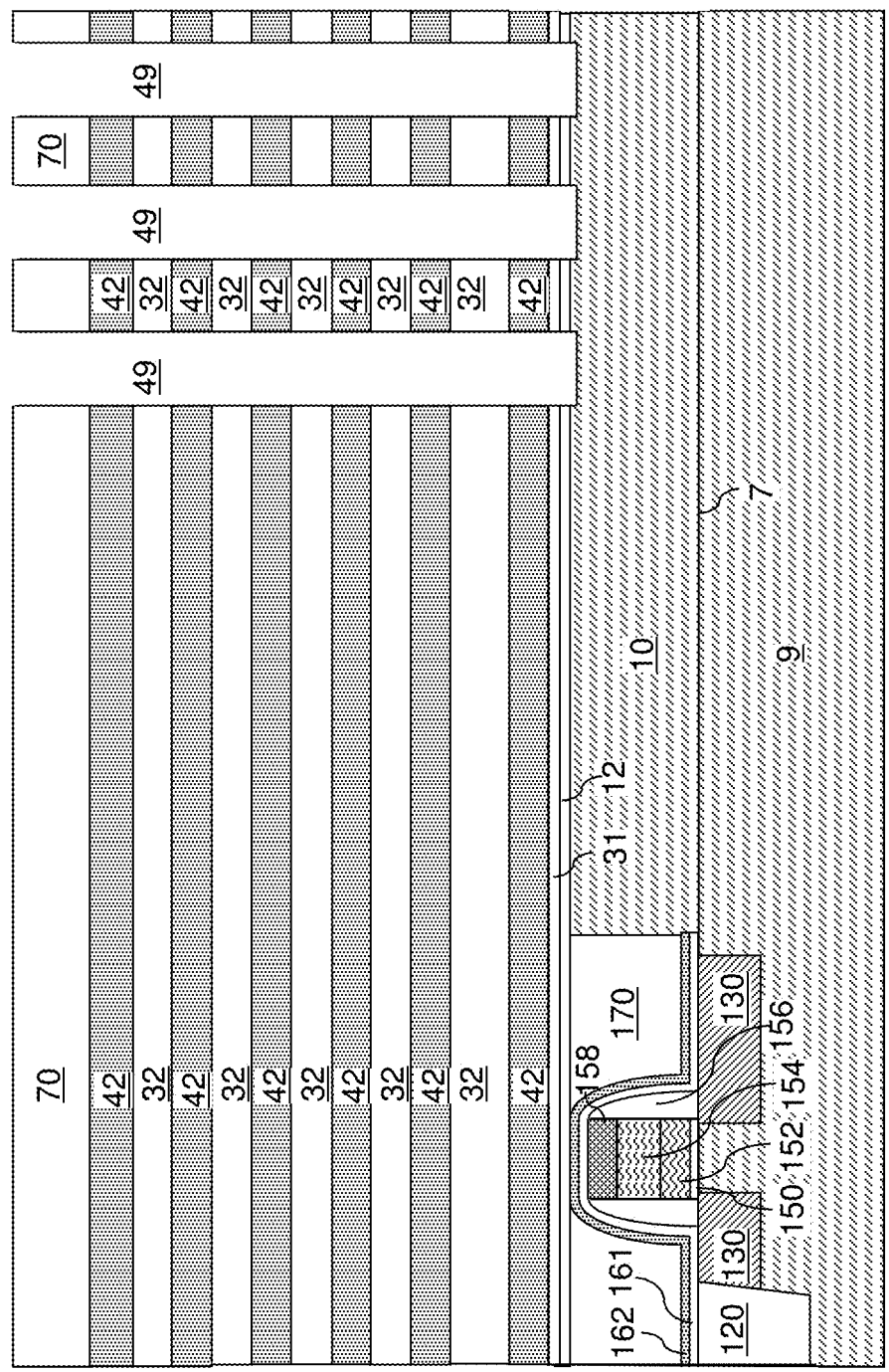
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor material 9.

A memory stack structure can be formed in each of the memory opening employing various embodiments of the present disclosure. FIGS. 2A-2F illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

A series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 5061, 601L).

Referring to FIG. 2B, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is embedded within a charge storage element 504. The charge storage element 504 can comprise a charge trapping material or a floating gate material.

In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2C, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2D, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2E, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Referring to FIG. 2F, drain regions 63 can be formed by depositing a doped semiconductor material within each recessed region above the dielectric cores 62. The doped semiconductor material can be, for example, in-situ doped polysilicon. N-type dopants (As, P) can be implanted in the drain region 63 to form a low resistivity contact region. The channel portion 60 can be doped with P-type dopants (e.g., boron) for controlling top select gate drain threshold voltage of the thin film transistor. Excess portions of the deposited semiconductor material can be removed from above the top surface of the insulating cap layer 70, for example, by chemical mechanical planarization (CMP) or a recess etch to form the drain regions 63.

Figure 3:
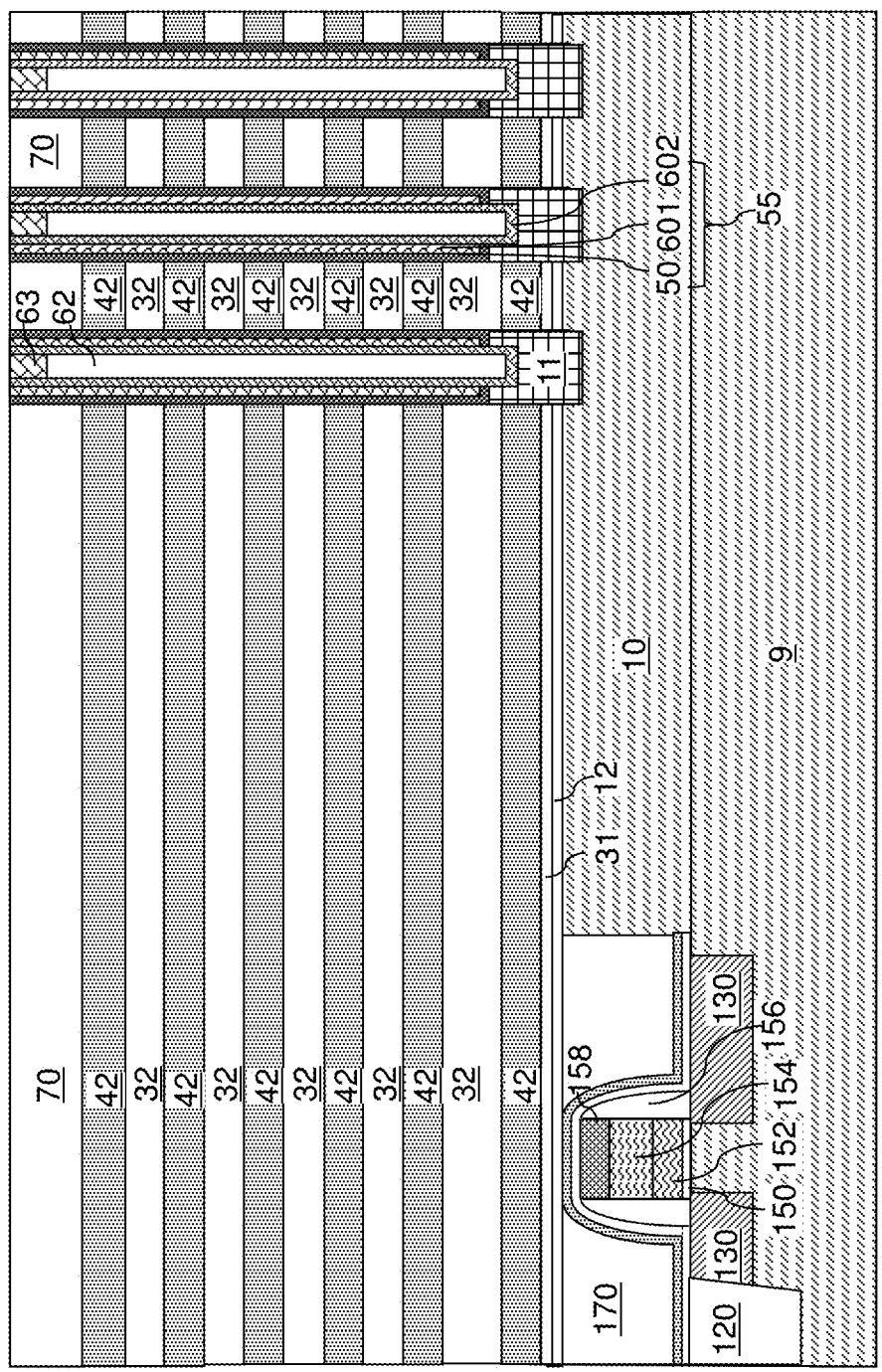
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
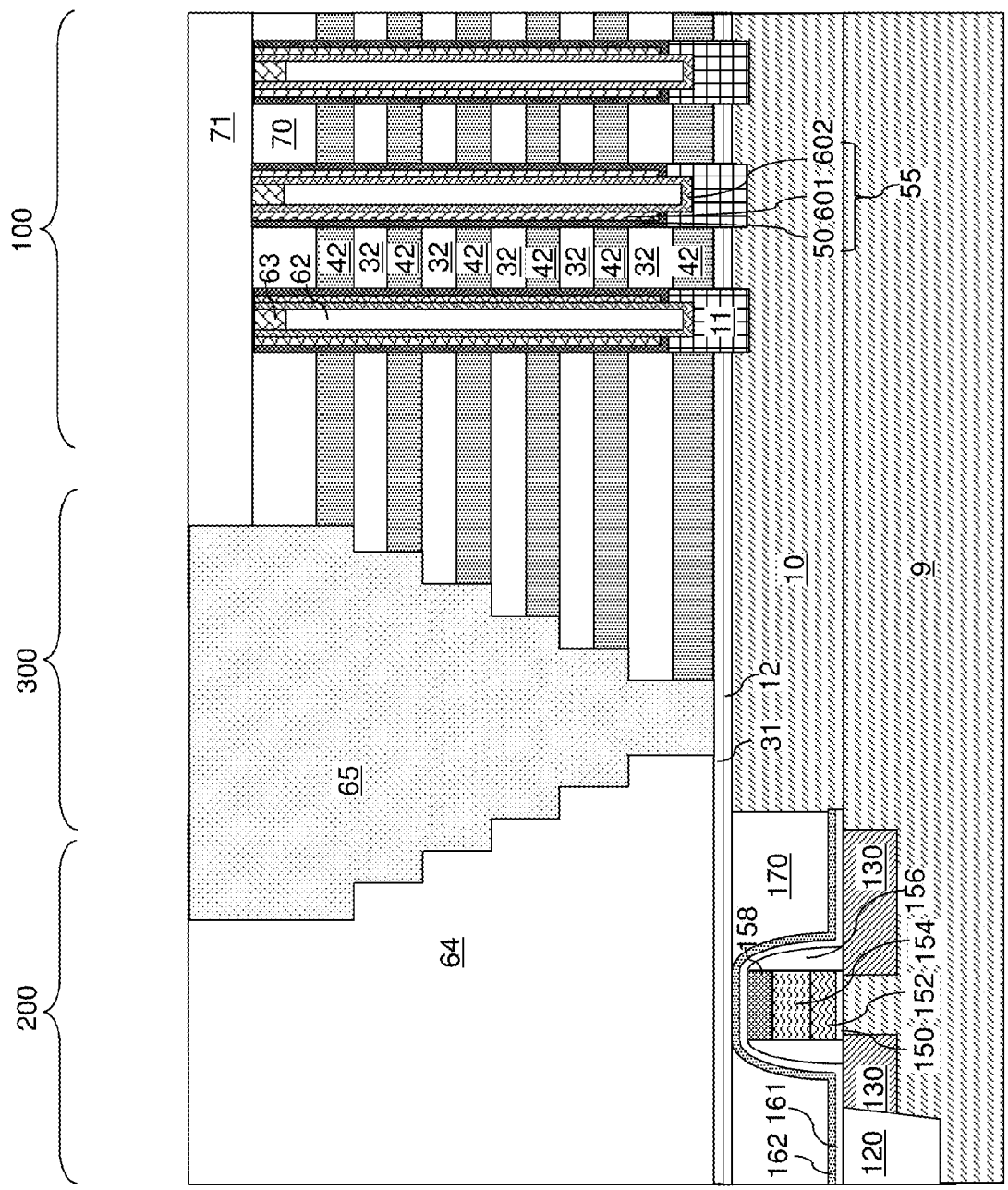
FIG. 4 is a vertical cross-sectional view of the first exemplary structure after formation of a stepped terrace and a retro-stepped dielectric material portion according to the first embodiment of the present disclosure.

Referring to FIG. 4, an optional first array contact level dielectric layer 71 can be formed over the substrate (9, 10). As an optional structure, the first array contact level dielectric layer 71 may, or may not, be formed. In case the first array contact level dielectric layer 71 is formed, the first array contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first array contact level dielectric layer 71 can be formed over a horizontal plane including the top surface of the insulating cap layer 70 and the top surfaces of the drain regions 63. The first array contact level dielectric layer 71 can be deposited by chemical vapor deposition, atomic layer deposition (ALD), spin-coating, or a combination thereof. The thickness of the first array contact level dielectric layer 71 can be in a range from 10 nm to 300 nm, although lesser and greater thicknesses can also be employed.

In one embodiment, the first array contact level dielectric layer 71 can be formed as a dielectric material layer having a uniform thickness throughout. The first array contact level dielectric layer 71 may be formed as a single dielectric material layer, or can be formed as a stack of a plurality of dielectric material layers. Alternatively, formation of the first array contact level dielectric layer 71 may be merged with formation of at least one line level dielectric layer (not shown). While the present disclosure is described employing an embodiment in which the first array contact level dielectric layer 71 is a structure separate from an optional second array contact level dielectric layer or at least one line level dielectric layer to be subsequently deposited, embodiments in which the first array contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first array contact level dielectric layer 71 by a planarization process such as chemical mechanical planarization and/or a recess etch. The top surfaces of the first array contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first array contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
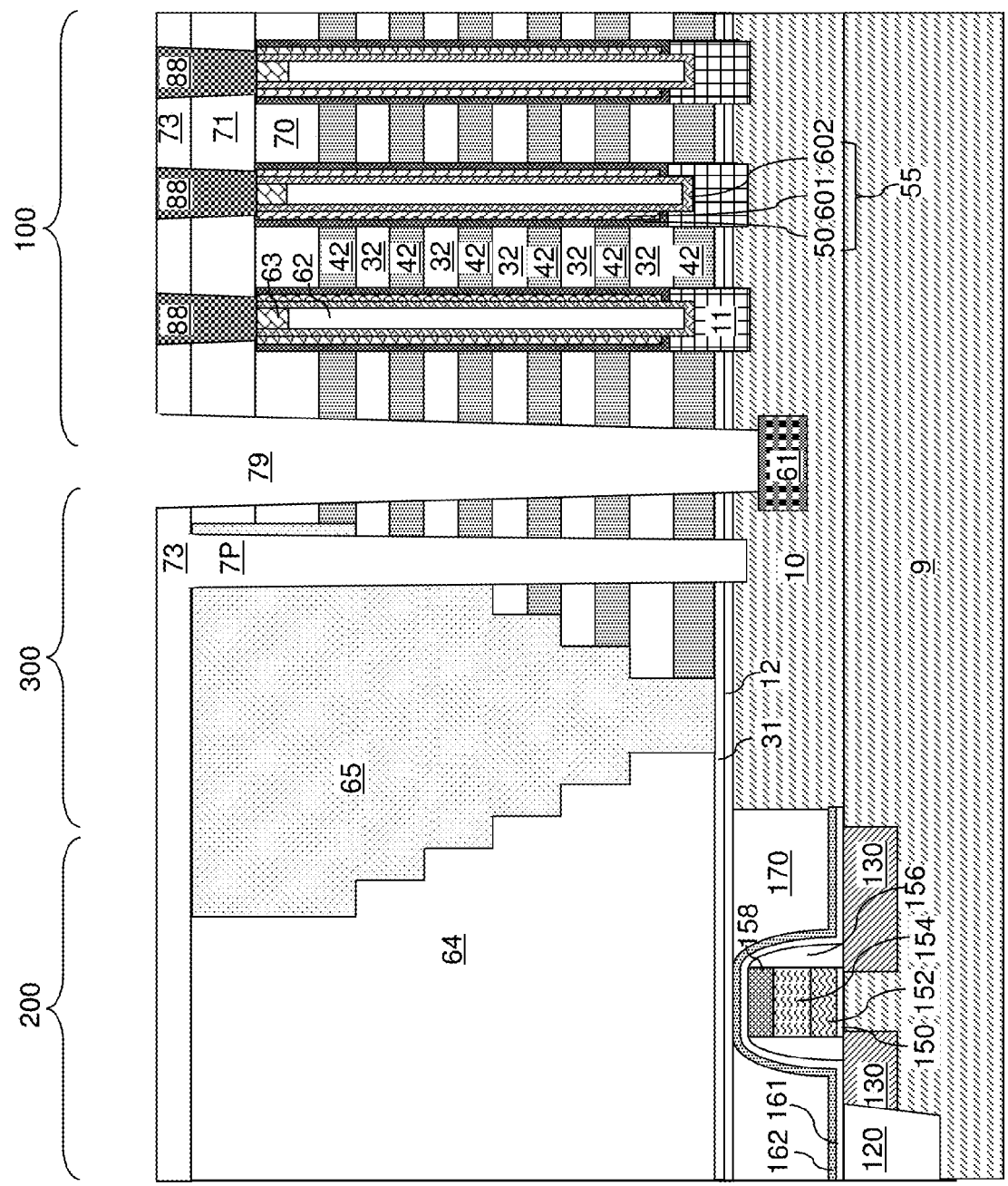
FIG. 5A is a vertical cross-sectional view of the first exemplary structure after formation of a backside contact trench according to the first embodiment of the present disclosure.

Referring to FIGS. 5A and 5B, at least one dielectric support pillar 7P may be optionally formed through the retro-stepped dielectric material portion 65 and/or through the first array contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first array contact level dielectric layer 71 concurrently with deposition of the at least one dielectric support pillar 7P can be present over the first array contact level dielectric layer 71 as a second array contact level dielectric layer 73. Each of the at least one dielectric support pillar 7P and the second array contact level dielectric layer 73 is an optional structure. As such, the second array contact level dielectric layer 73 may, or may not, be present over the insulating cap layer 70 and the retro-stepped dielectric material portion 65. The first array contact level dielectric layer 71 and the second array contact level dielectric layer 73 are herein collectively referred to as at least one array contact level dielectric layer (71, 73). In one embodiment, the at least one array contact level dielectric layer (71, 73) can include both the first and second array contact level dielectric layers (71, 73), and optionally include any additional via level dielectric layer that can be subsequently formed. In another embodiment, the at least one array contact level dielectric layer (71, 73) can include only the first array contact level dielectric layer 71 or the second array contact level dielectric layer 73, and optionally include any additional via level dielectric layer that can be subsequently formed. Alternatively, formation of the first and second array contact level dielectric layers (71, 73) may be omitted, and at least one via level dielectric layer may be subsequently formed, i.e., after formation of a backside contact via structure.

The second array contact level dielectric layer 73 and the at least one dielectric support pillar 7P can be formed as a single contiguous structure of integral construction, i.e., without any material interface therebetween. In another embodiment, the portion of the dielectric material that is deposited over the first array contact level dielectric layer 71 concurrently with deposition of the at least one dielectric support pillar 7P can be removed, for example, by chemical mechanical planarization or a recess etch. In this case, the second array contact level dielectric layer 73 is not present, and the top surface of the first array contact level dielectric layer 71 can be physically exposed.

Memory contact via structures 88 can be formed through the first and second array contact level dielectric layers (73, 71). Specifically, a photoresist layer can be applied over the second array contact level dielectric layer 73, and can be lithographically patterned to form openings overlying the drain structures 63. An anisotropic etch can be performed to transfer the pattern in the photoresist layer through the first and second array contact level dielectric layers (73, 71) to form memory contact via cavities that extend through the first and second array contact level dielectric layers (73, 71). The memory contact via cavities can be filled with at least one conductive material. Excess portions of the at least one conductive material can be removed from above a horizontal plane including a top surface of the second array contact level dielectric layer 73. Each remaining contiguous portion of the at least one conductive material constitutes a memory contact via structure 88, which contacts a top surface of an underlying drain region 63. The photoresist layer can be subsequently removed, for example, by ashing.

Another photoresist layer (not shown) can be applied over the alternating stack (32, 42) and/or the retro-stepped dielectric material portion 65, and is lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. A source region 61 can be formed by implanting electrical dopants through each backside contact trench into a semiconductor portion located on, or within, the substrate (9, 10). For example, a source region 61 may be formed by implantation of dopant atoms into a portion of the semiconductor material layer 10 through each backside contact trench 79. Alternatively, a semiconductor portion can be formed on the substrate (9, 10) by deposition of a semiconductor material, for example, by selective epitaxy, and by implantation of electrical dopants into the deposited semiconductor portion.

Figure 6:
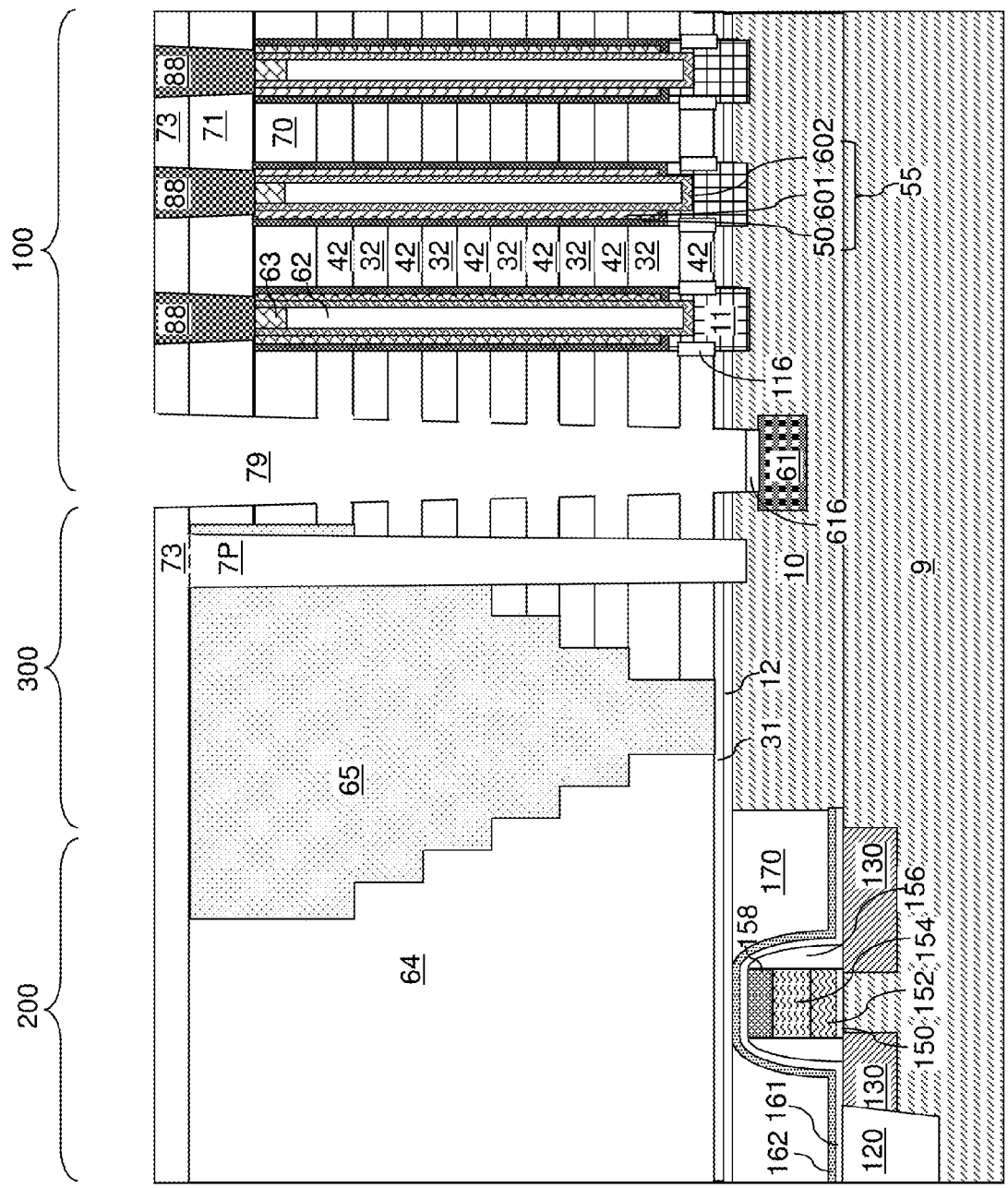
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7:
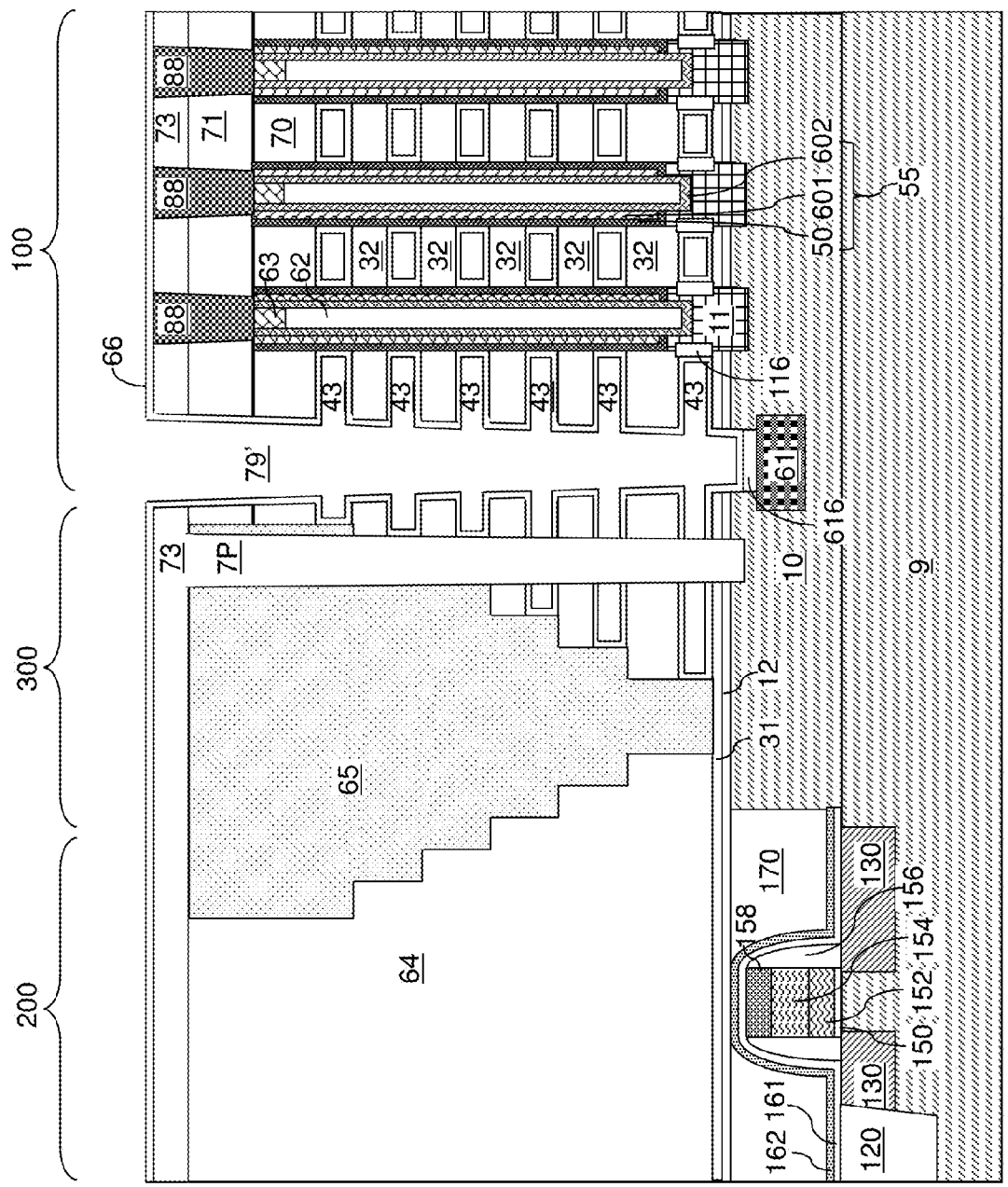
FIG. 7 is a vertical cross-sectional view of the first exemplary structure after formation of a backside blocking dielectric layer according to the first embodiment of the present disclosure.

Referring to FIG. 7, a backside blocking dielectric layer 66 can be optionally formed. The backside blocking dielectric layer 66 comprises a dielectric material that functions as a control gate dielectric for the control gates to be subsequently formed in the backside recesses 43. In case the at least one blocking dielectric layer (501, 503) is present within each memory opening, the backside blocking dielectric layer 66 is optional. In case the at least one blocking dielectric layer (501, 503) is omitted, the backside blocking dielectric layer 66 is present.

The dielectric material of the backside blocking dielectric layer 66 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. The backside blocking dielectric layer 66 can be deposited by a conformal deposition method such as chemical vapor deposition or atomic layer deposition. The thickness of the backside blocking dielectric layer 66 can be in a range from 1 nm to 10 nm, although lesser and greater thicknesses can also be employed. The backside blocking dielectric layer 66 is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of a source region 61 (if formed prior to formation of the backside blocking dielectric layer 66). A backside cavity 79' is present within the portion of each backside via trench 79 that is not filled with the backside blocking dielectric layer 66.

Figure 8:
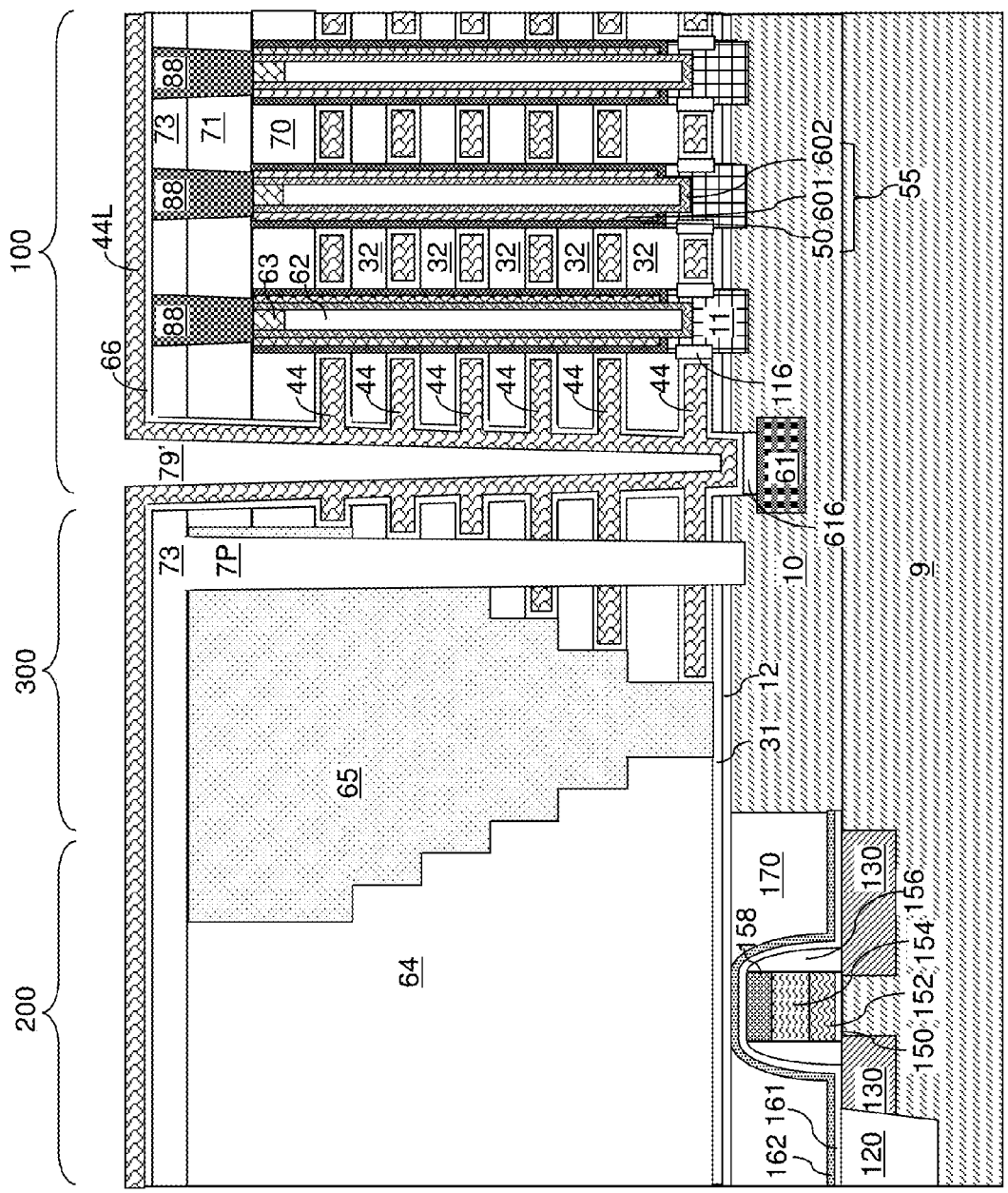
FIG. 8 is a vertical cross-sectional view of the first exemplary structure after formation of doped semiconductor material lines according to the first embodiment of the present disclosure.

Referring to FIG. 8, a doped semiconductor material can be deposited in the plurality of backside recesses 43, on the sidewalls of the at least one the backside contact trench 79, and over the top surface of the second array contact level dielectric layer 73 (or the topmost layer of the first array contact level dielectric layer 71 if the second array contact level dielectric layer 73 is not employed). The doped semiconductor material can be any type of semiconductor material having a p-type doping or n-type doping at a dopant concentration of at least $10^{20}/cm^3$. The doped semiconductor material is a conductive material, i.e., a material having electrical conductivity greater than $1.0 \times 10^5$ S/cm. Each backside recess 43 is filled with a doped semiconductor material portion 44. Since the doped semiconductor material gradually fills each backside recess 43, each doped semiconductor material portion 44 which can have a horizontal seam line because the doped semiconductor material grows inward from the horizontal surfaces of the backside blocking dielectric layer 66 within each backside recess 43.

The doped semiconductor material can be deposited by a conformal deposition method such as chemical vapor deposition (CVD). In one embodiment, the doped semiconductor material for filling the plurality of backside recesses 43 can be doped polysilicon or doped amorphous silicon, and can be formed by low pressure chemical vapor deposition (LP-CVD). In one embodiment, in-situ doping can be employed to incorporate electrical dopants into the deposited doped semiconductor material.

A plurality of doped semiconductor material layers, i.e., doped semiconductor material lines, can be formed in the plurality of backside recesses 43, and a contiguous doped semiconductor material layer 44L can be formed on the sidewalls of each backside contact trench 79 and over the second array contact level dielectric layer 73 (or the topmost layer of the exemplary structure in case the second array contact level dielectric layer 73 is not employed). Thus, each sacrificial material layer 42 can be replaced with a doped semiconductor material layer, which is a doped semiconductor material portion that fills a respective backside recess. A backside cavity 79' is present in the portion of each backside contact trench 79 that is not filled with the backside blocking dielectric layer 66 and the contiguous doped semiconductor material layer 44L.

Figure 9:
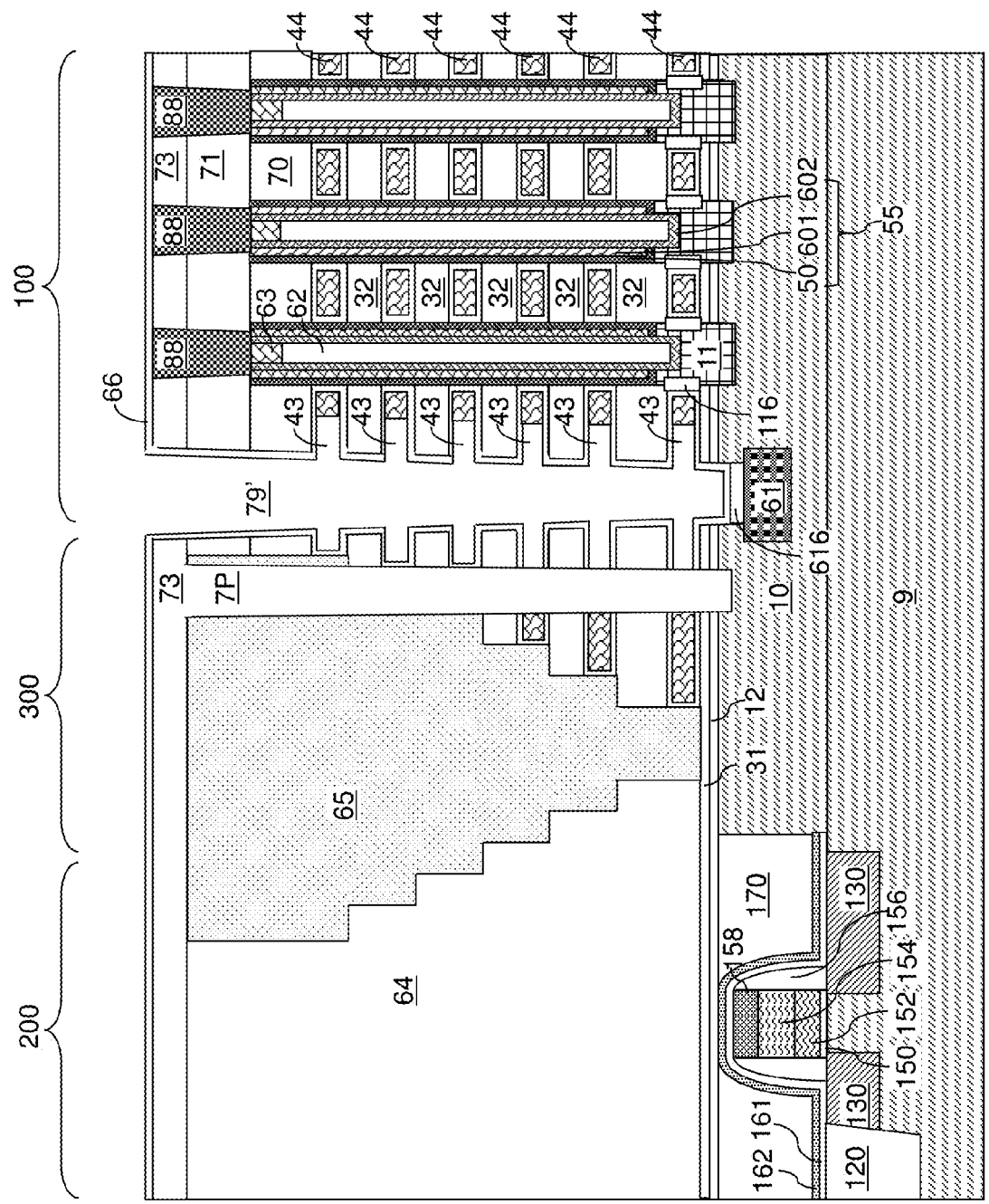
FIG. 9 is a vertical cross-sectional view of the first exemplary structure after recessing of the doped semiconductor material lines according to the first embodiment of the present disclosure.

Referring to FIG. 9, portions of the deposited doped semiconductor material can be recessed by an isotropic etch, or by a combination of an anisotropic etch and an isotropic etch. The contiguous doped semiconductor material layer 44L is removed from above the at least one array contact level dielectric layer (71, 73) and from the sidewalls of the at least one backside contact trench 79. Further, each doped semiconductor material portion 44 can be laterally recessed from an adjacent sidewall of a backside contact trench 79 by an isotropic etch. An outer portion of each doped semiconductor material portion 44 is removed by the isotropic etch from regions distal from the memory stack structures 55, i.e., from regions proximal to the at least one backside contact trench 79. The remaining portions of the doped semiconductor material are doped semiconductor material portions 44, which are incorporated into composite electrically conductive layers to be subsequently formed. Backside recesses 43 are present adjacent to each doped semiconductor material portion 44. The lateral distance between an outer sidewall of each doped semiconductor material portion 44 and a proximal sidewall of a backside contact trench 79 can be uniform throughout the various levels in which the doped semiconductor material portions 44 are present. In this case, the lateral extent of each backside recess 43, as measured from a sidewall of a doped semiconductor material portion 44 that the backside recess 43 adjoins and to the proximal sidewall of the backside contact trench 79, can be the same across the various levels in which the doped semiconductor material portions 43 are present.

Figure 10:
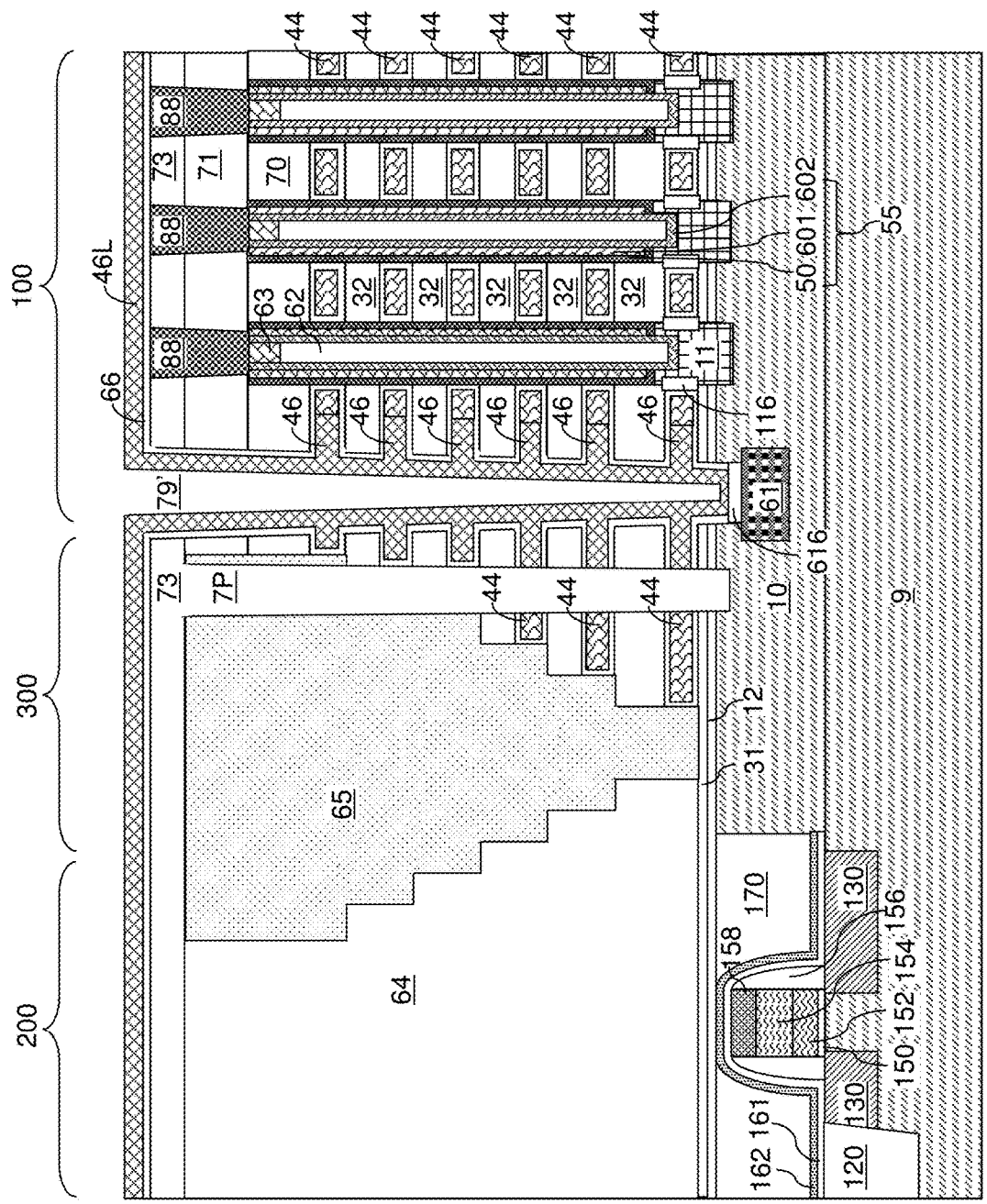
FIG. 10 is a vertical cross-sectional view of the first exemplary structure after formation of metallic material layers according to the first embodiment of the present disclosure.

Referring to FIG. 10, at least one metallic material can be deposited in a respective volume of the backside recesses 43 from which the doped semiconductor material is removed by recessing. At least one metallic material can be deposited in the plurality of backside recesses 43, on the sidewalls of the at least one the backside contact trench 79, and over the top surface of the at least one array contact level dielectric layer (71, 73). As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride liner and a tungsten fill material. In one embodiment, the metallic material can be deposited by chemical vapor deposition.

In one embodiment, deposition of the metallic material can be effected by reduction of a fluorine-containing precursor gas. Fluorine atoms may be present in the deposited metallic material in a compound form at an atomic concentration at the level from 10 parts per billion (p.p.b.) to 100 parts per million (p.p.m.). For example, a tungsten fill material portion deposited by reduction of WF6 can be employed as a portion of the deposited metallic material, which can contain fluorine atoms at a low concentration. Generally speaking, fluorine atoms incorporated into a metallic material can combine with silicon atoms in silicon-containing dielectric materials (such as silicon oxide or silicon nitride) or silicon-containing semiconductor materials (such as polysilicon) to form a volatile compound (such as $SiH_4$). Thus, it is desirable to induce the fluorine atoms to escape without causing damage or to prevent diffusion of the fluorine atoms to regions where electrical short is not desired.

Alternatively, deposition of the metallic material can be effected employing a precursor that does not include fluorine for a subset of metallic materials. For example, a metallic material such as ruthenium can be deposited without employing a fluorine-containing precursor by employing a ruthenium oxide precursor gas and a reducing agent as described in U.S. Patent Application Publication No. 2011/0165780. In such cases, the deposited metallic material portion does not include fluorine.

A plurality of metallic material portions 46 can be formed in the plurality of backside recesses 43, and a contiguous metallic material layer 46L can be formed on the sidewalls of each backside contact trench 79 and over the at least one array contact level dielectric layer (71,73). Thus, each sacrificial material layer 42 can be replaced with an electrically conductive layer (44, 46) that includes a combination of a conductive material portion 46 and at least one doped semiconductor material portion 44 that contacts a sidewall of the conductive material portion 46. A backside cavity 79' is present in the portion of each backside contact trench 79 that is not filled with the backside blocking dielectric layer 66 and the contiguous metallic material layer 46L.

Each electrically conductive layer (44, 46) that includes an adjoining set of at least one doped semiconductor material portion 44 and a metallic material portion 46 is herein referred to as a composite electrically conductive layer (44, 46). Each metallic material portion 46 of the composite electrically conductive layers (44, 46) is formed by depositing at least one metallic material in a respective volume of the backside recesses 44 from which the doped semiconductor material is removed by recessing. Each metallic material portion 46 in a composite electrically conductive layer (44, 46) contacts a sidewall of a doped semiconductor material portion 44, and is laterally spaced from a most proximal memory stack structure 55 by at least the doped semiconductor material portion 44. In one embodiment, the lateral distance between an interface between a pair of a doped semiconductor material portion 44 and a metallic material portion 46 can be laterally offset from the sidewall of an adjacent backside contact trench 79 for a plurality of composite electrically conductive layers (44, 46) located at different levels. In one embodiment, doped semiconductor material portions 44 located at different levels can have different lateral extents, and metallic material portions located at different levels can have the same lateral extent, i.e., the lateral extent between the respective interface with a doped semiconductor material portion 44 and the sidewall of the most proximal backside contact trench 79.

Figure 11:
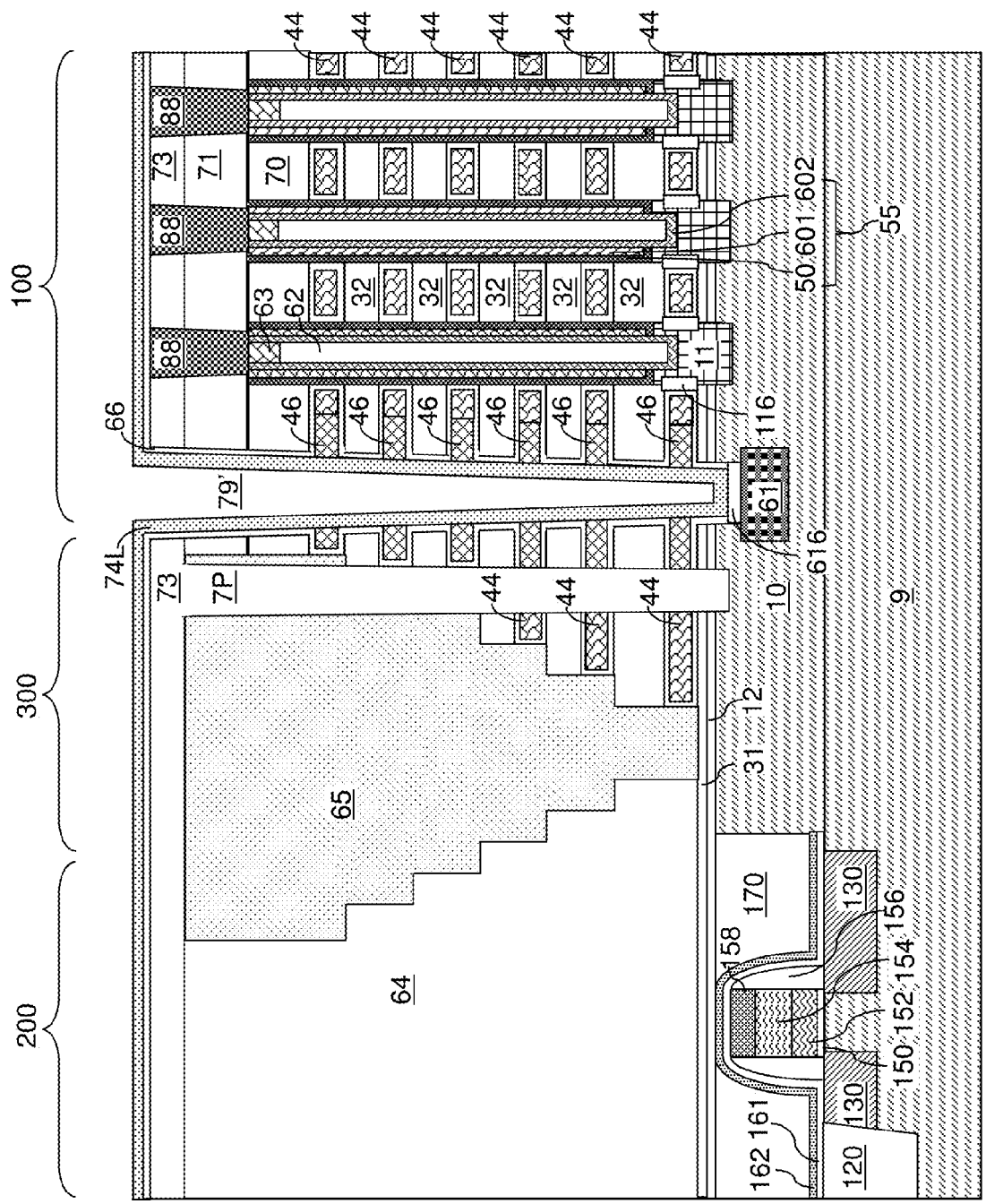
FIG. 11 is a vertical cross-sectional view of the first exemplary structure after formation of an insulating spacer according to the first embodiment of the present disclosure.

Referring to FIG. 11, the deposited metallic material of the contiguous metallic material layer 46L is etched back from the sidewalls of each backside contact trench 79 and from above the at least one array contact level dielectric layer (71, 73), for example, by an isotropic etch. Each remaining portion of the deposited metallic material in the backside recesses 43 constitutes an electrically conductive portion 46, which can be a component of a respective composite electrically conductive layer (44, 46). Each composite electrically conductive layer (44, 46) can be a conductive line structure. Thus, the sacrificial material layers 42 are replaced with the composite electrically conductive layers (44, 46).

Each composite electrically conductive layer (44, 46) can function as a combination of a plurality of control gate electrodes located at a same level and a word line electrically interconnecting, i.e., electrically shorting, the plurality of control gate electrodes located at the same level. The plurality of control gate electrodes within each composite electrically conductive layer (44, 46) are the control gate electrodes for the vertical memory devices including the memory stack structures 55. In other words, each composite electrically conductive layer (44, 46) can be a word line that functions as a common control gate electrode for the plurality of vertical memory devices.

An insulating material layer 74L can be formed in the at least one backside contact trench 79 and over the at least one array contact level dielectric layer (71, 73) by a conformal deposition process. Exemplary conformal deposition processes include, but are not limited to, chemical vapor deposition and atomic layer deposition. The insulating material layer 74L includes an insulating material such as a dielectric metal oxide, silicon oxide, silicon nitride, or a combination thereof. The thickness of the insulating material layer 74L can be in a range from 1.5 nm to 60 nm, although lesser and greater thicknesses can also be employed.

In one embodiment, the insulating material layer 74L comprises a dielectric metal oxide. In one embodiment, the dielectric metal oxide of the insulating material layer 74L can be selected from a dielectric oxide of at least one transition metal element, a dielectric oxide of at least one rare earth element, a dielectric oxynitride of at least one transition metal element, a dielectric oxynitride of at least one rare earth element, aluminum oxide, and combinations thereof. In one embodiment, the dielectric metal oxide of the insulating material layer 74L can comprise aluminum oxide.

In case a dielectric metal oxide is employed as the material of the insulating material layer 74L, the dielectric metal oxide can block vertical diffusion of any fluorine atoms that are collaterally incorporated into the metallic material portions 46 of the composite electrically conductive layers (44, 46).

Figure 12A:
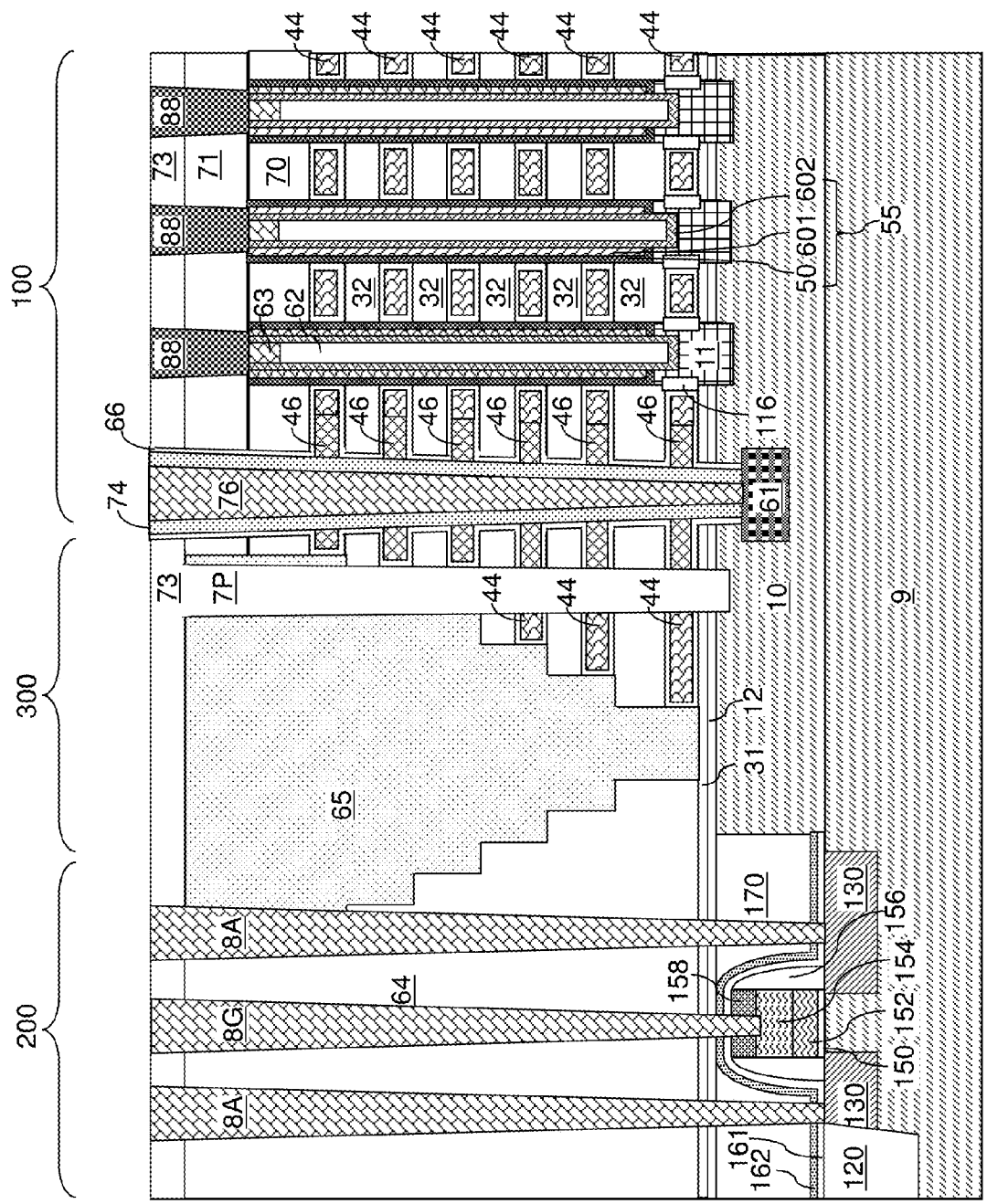
FIG. 12A is a vertical cross-sectional view of the first exemplary structure after formation of a backside contact via structure according to the first embodiment of the present disclosure.
Figure 12B:
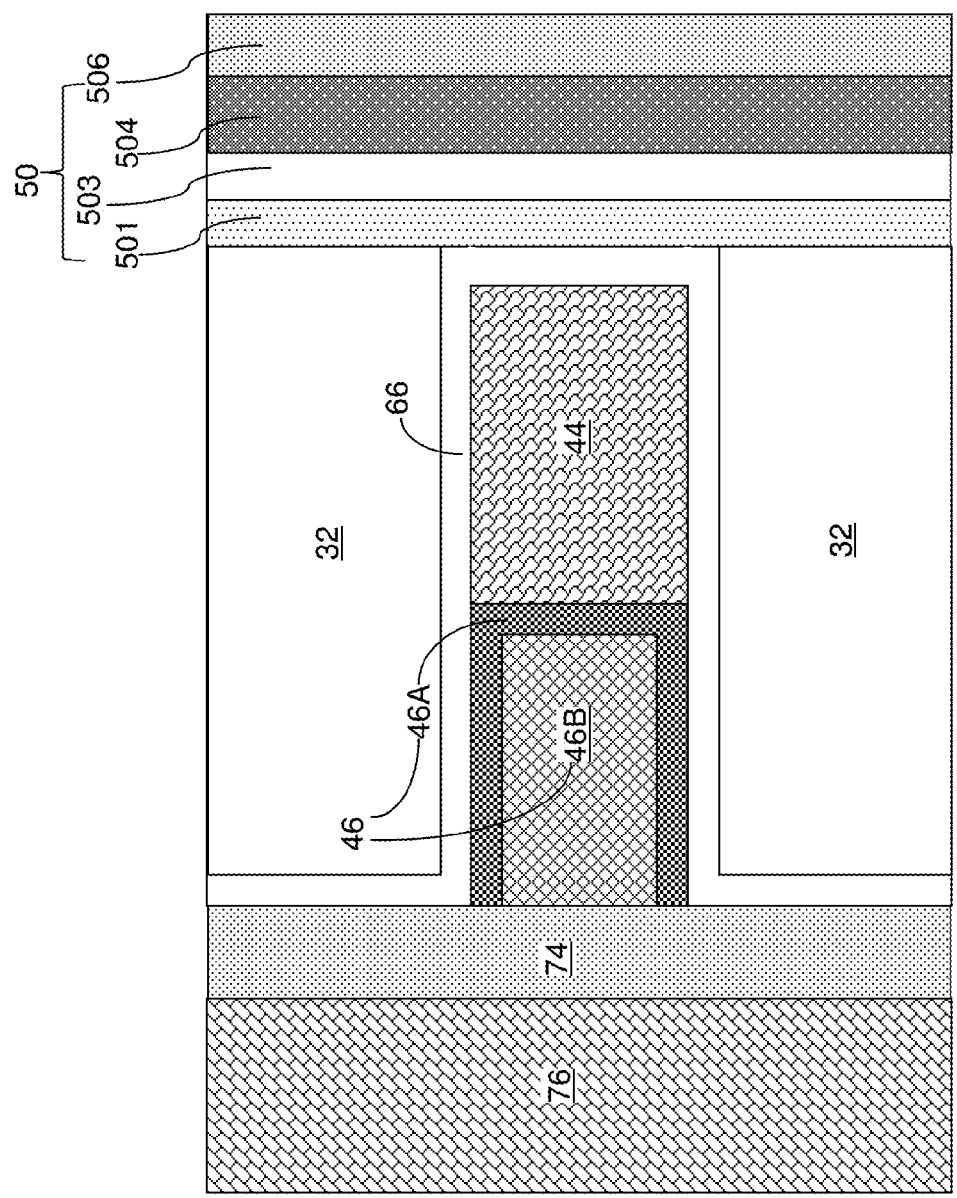
FIG. 12B is a magnified view of a region of the first exemplary structure of FIG. 12A.

Referring to FIGS. 12A and 12B, an anisotropic etch is performed to remove horizontal portions of the insulating material layer 74L. The sacrificial dielectric portions 616 can be removed from above the source regions 61 during the anisotropic etch. Each remaining portion of the insulating material layer 74L inside a backside contact trench 79 constitutes a vertically elongated annular structure with a vertical cavity therethrough, which is herein referred to as an insulating spacer 74. In one embodiment, an annular bottom surface of the insulating spacer 74 contacts a top surface of the source region 61.

Each insulating spacer 74 can be formed over the sidewalls of the backside contact trench 79, and can be formed directly on substantially vertical sidewalls of the backside blocking dielectric layer 66 and directly on the sidewalls of the composite electrically conductive layers (44, 46), i.e., directly on the sidewalls of the metallic material portions 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. In one embodiment, each insulating spacer 74 can comprise a dielectric metal oxide such as aluminum oxide.

A photoresist layer (not shown) can be applied over the topmost layer of the exemplary structure (which can be, for example, the second array contact level dielectric layer 73) and in the cavity laterally surrounded by the insulating spacer 74, and can be lithographically patterned to form various openings in a peripheral device region 200. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The vertical extent of each gate via cavity, as measured from the top surface of the second array contact level dielectric layer 73 to the bottom surface of the gate via cavity, can be less than the vertical distance between the top surface of the second array contact level dielectric layer 73 and the topmost surface of the alternating plurality (32, 46) of the insulating layers 32 and the electrically conductive layers 46. The photoresist layer can be subsequently removed, for example, by ashing.

Another photoresist layer (not shown) can be applied over the exemplary structure, and can be lithographically patterned to form openings within the contact region 300 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective composite electrically conductive layer (44, 46). The photoresist layer can be subsequently removed, for example, by ashing.

Each backside cavity 79' surrounded by an insulating spacer 74, the various via cavities in the peripheral device region 200, and the control gate contact via cavities in the contact region 300 can be filled with a conductive material to form various contact via structures. For example, a backside contact via structure 76 can be formed in each backside cavity 79' surrounded by an insulating spacer 74. A gate contact via structure 8G can be formed in each gate via cavity in the peripheral device region 200. An active region via structure 8A is formed in each active region via cavity in the peripheral device region 200. Further, control gate contact via structures (not shown) can be formed within each contact via cavity that extends to a top surface of the electrically conductive layers 46 in the contact region 300. Each backside contact via structure 76 can be electrically shorted to a portion of the substrate (9, 10, 61) through an insulating spacer 74 and within a backside contact trench 79. In one embodiment, the portion of the substrate (9, 10, 71) to which a backside contact via structure 76 (which can be a source line) is electrically shorted can be a source region 61.

Optionally, additional dielectric material layers (not shown) may be added to the at least one array contact level dielectric layer (71, 73). The additional dielectric material layers, if present, comprises a dielectric material such as silicon oxide, silicon nitride, silicon oxynitride, and/or organosilicate glass. Suitable metal interconnect structures can be formed in the additional dielectric material layers.

The first exemplary structure includes a monolithic three-dimensional memory device. The monolithic three-dimensional memory device comprises a stack of alternating layers comprising insulating layers 32 and electrically conductive layers (44, 46) and located over a substrate (9, 10, 61), an array of memory openings extending through the stack, and a plurality of memory stack structures 55 located within a respective memory opening. The electrically conductive layers (44, 46) comprise composite electrically conductive layers (44, 46). Each composite electrically conductive layer (44, 46) comprises a doped semiconductor material portion 44 and a metallic material portion 46. The metallic material portion 46 contacts a sidewall of the doped semiconductor material portion 44 and is laterally spaced from a most proximal memory stack structure 55 by at least the doped semiconductor material portion 44.

In one embodiment, each composite electrically conductive layer (44, 46) can contact horizontal surfaces of a backside blocking dielectric layer 66 and a sidewall surface of the backside blocking dielectric layer 66. In one embodiment, the backside blocking dielectric layer 66 comprises a dielectric metal oxide, which is herein referred to as a first dielectric metal oxide. In one embodiment, each doped semiconductor material portion 44 within a respective composite electrically conductive layer (44, 46) can contact a horizontal bottom surface of an overlying portion of the backside blocking dielectric layer 66, a horizontal top surface of an underlying portion of the backside blocking dielectric layer 66, and a sidewall surface of a vertical portion of the backside blocking dielectric layer 66.

In one embodiment, each metallic material portion 46 within a respective composite electrically conductive layer (44, 46) contacts a horizontal bottom surface of an overlying portion of the backside blocking dielectric layer 66, and a horizontal top surface of an underlying portion of the backside blocking dielectric layer 66. A backside contact via structure 76 can extend through the stack, and an insulating spacer 74 can laterally surround the backside contact via structure 76. Each metallic material portion 46 within a respective composite electrically conductive layer (44, 46) can contact an outer sidewall of the insulating spacer 74. In one embodiment, the insulating spacer extends comprises a dielectric metal oxide.

As shown in FIG. 12B, each metallic material portion 46 can comprise a metallic liner portion 46A comprising a conductive metallic compound of at least one elemental metal and a non-metallic element and contacting a respective doped semiconductor material portion 44, and a metal fill portion 46B comprising at least one elemental metal and laterally spaced from the respective doped semiconductor material portion 44 by the metallic liner portion 46A. In one embodiment, the metallic liner portion 46A can comprise a conductive metallic nitride (such as titanium nitride, tantalum nitride, and/or tungsten nitride), and the metal fill portion 48B can comprise at least one elemental metal (such as tungsten, copper, aluminum, cobalt, and/or ruthenium). Outer sidewalls of the metallic liner portion 46A and the metal fill portion 48B contact a sidewall of an insulating spacer 74. Horizontal surfaces of the metallic liner portion 46A can contact surfaces of the backside blocking dielectric layer 66 or surfaces of the insulating layers 32 (if the backside blocking dielectric layer 66 is not employed). Further, a sidewall of the metallic liner portion 46A can contact an outer sidewall of a doped semiconductor material portion 44.

In one embodiment, each of the plurality of memory stack structures 55 can comprise a vertical stack of memory elements (which can be embodied as a memory material layer 504), a tunneling dielectric layer 506, and a vertical semiconductor channel 60.

In one embodiment, the memory device of the present disclosure can be a monolithic three-dimensional memory device comprising a vertical NAND device located over the substrate (9, 10, 61), and the electrically conductive layers (44, 46) can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

Each NAND string can comprise a plurality of semiconductor channels. At least one end portion of each of the plurality of semiconductor channels extends substantially perpendicular to a top surface of the substrate (9, 10). In one embodiment, the plurality of semiconductor channels can comprise a common horizontal semiconductor channel portion that is a portion of the semiconductor material layer 10 between a source region 61 and the epitaxial channel portions 11, the epitaxial channel portions 11, and the vertical semiconductor channels 60 that are portions of the memory stack structures 55. Each NAND string can comprise a plurality of charge storage elements (which can be embodied as sections of a memory material layer 504 that is present within each memory stack structure 55). Each charge storage element can be located adjacent to a respective one of the plurality of semiconductor channels, i.e., adjacent to a respective vertical semiconductor channel 60. Each NAND string can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

In one embodiment, only a doped semiconductor material portion 44 and portions of the backside blocking dielectric layer 66 between some pairs of memory stack structures 55 located on the same side with respect to each backside contact via structure 76. In other words, a contiguous space extending between a neighboring pair of memory stack structures 55 within a level of the electrically conductive layers (44, 46) can be entirely filled with material portions consisting the backside blocking dielectric layer 66 (e.g., vertical and/or horizontal portions) and a portion of a doped semiconductor material portion 44. If the backside blocking dielectric layer 66 is omitted, then the contiguous space is filled entirely by a doped semiconductor material portion 44. Therefore, in either case, the contiguous space excludes the metallic material (e.g., tungsten, titanium nitride, etc.) of the metallic material portions 46. Preferably, the contiguous space is a located between the "inner" sides of the neighboring pair of memory stack structures 55 facing away from the nearest respective trench 79. In contrast, the metallic material portions 46 are located between and "outer" sides of the a memory stack structure 55 facing toward the nearest respective trench 79 and the nearest respective trench 79.

Figure 13A:
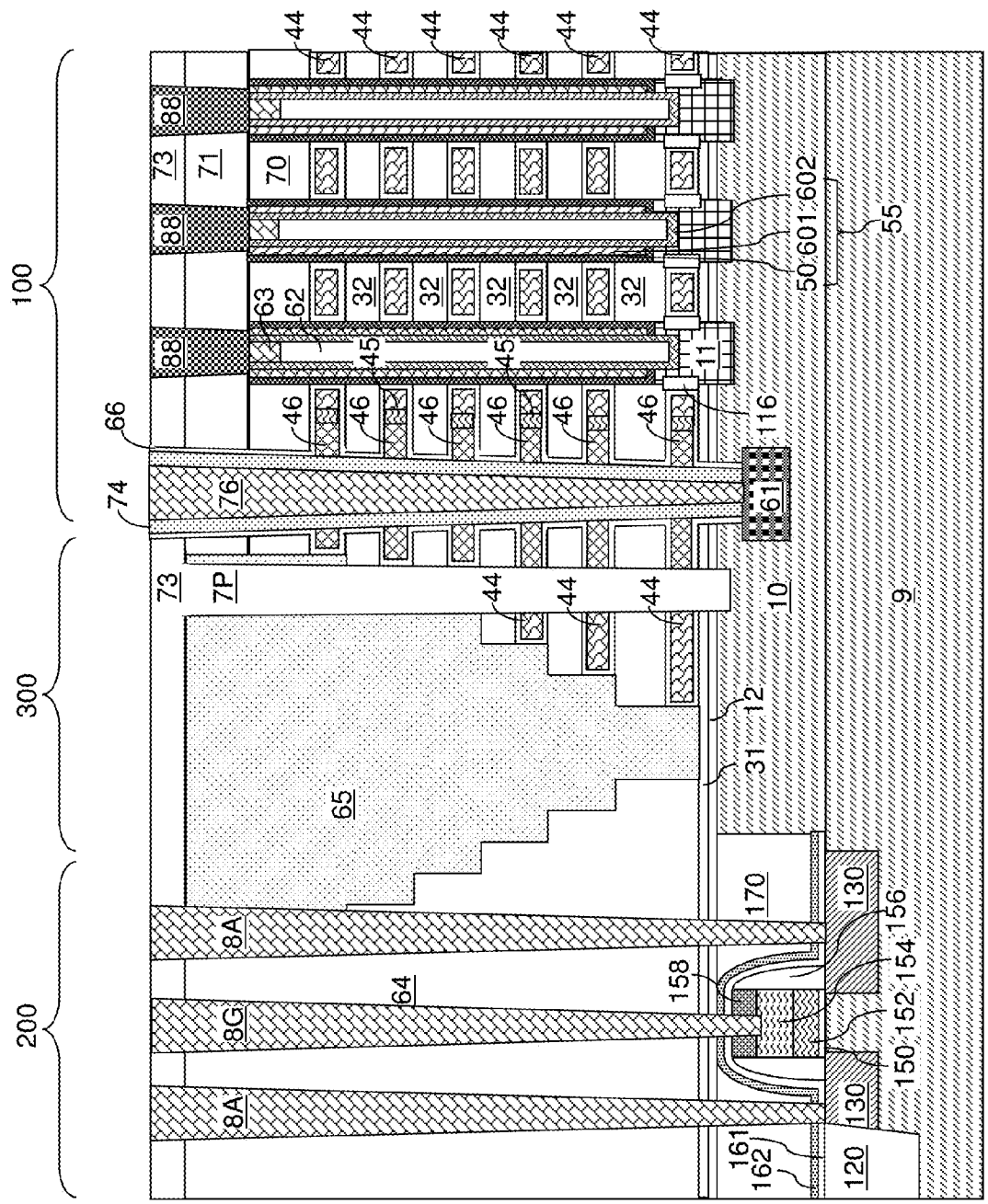
FIG. 13A is a vertical cross-sectional view of an alternative embodiment of the first exemplary structure after formation of a backside contact via structure according to the first embodiment of the present disclosure.
Figure 13B:
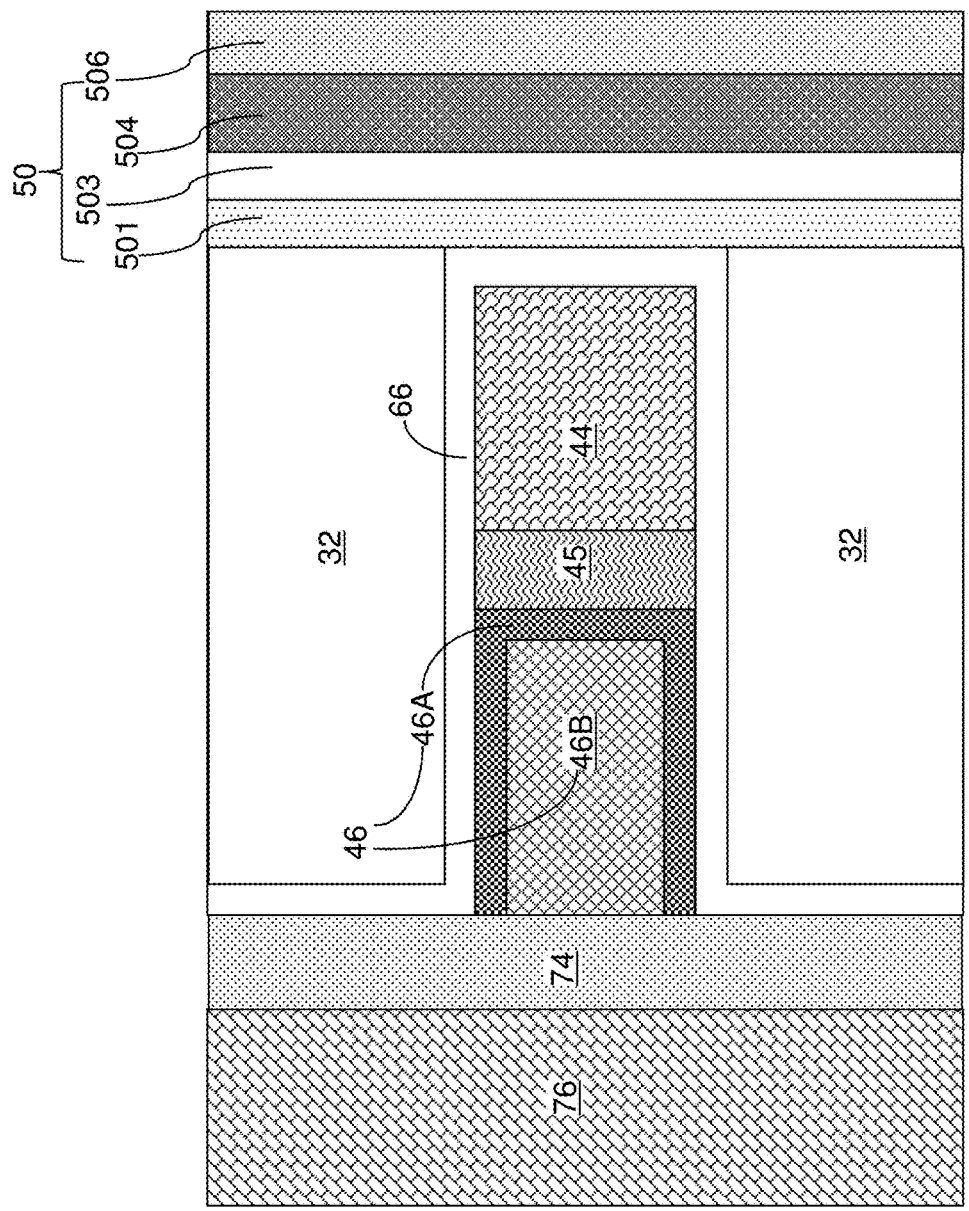
FIG. 13B is a magnified view of a region of the alternative embodiment of the first exemplary structure of FIG. 13A.

Referring to FIGS. 13A and 13B, an alternative embodiment of the first exemplary structures is shown, which includes metal-semiconductor alloy portions 45 formed by reaction of the semiconductor material of the doped semiconductor material portions 44 and the metallic material portions 46. Formation of the metal-semiconductor alloy portions 45 can be effected by selecting a material that reacts with the semiconductor material of the doped semiconductor material portions 44 as a metallic material to be deposited at the processing step of FIG. 10. In this case, each composite electrically conductive layer (44, 45, 46) comprises a doped semiconductor material portion 44, a metal-semiconductor alloy portion 45, and a metallic material portion 46. Each metal-semiconductor alloy portion 45 can contact a sidewall of a doped semiconductor material portion 44 and a sidewall of a metallic material portion 46. The metal-semiconductor alloy portions 45 can be formed by including a reaction of the semiconductor material of the doped semiconductor material portions 44 and the metallic material of the metallic material portions 46 in an anneal at an elevated temperature (such as a temperature between 500 degrees Celsius to 900 degrees Celsius), and thus, includes an alloy (such as a metal silicide) of the semiconductor material of the doped semiconductor material portions 44 and the metallic material of the metallic material portions 46. Thus, when the doped semiconductor material portions 44 comprise silicon (e.g., polysilicon), then the metal-semiconductor alloy portions 45 comprise a silicide, such as tungsten silicide, titanium silicide, etc.

Figure 14:
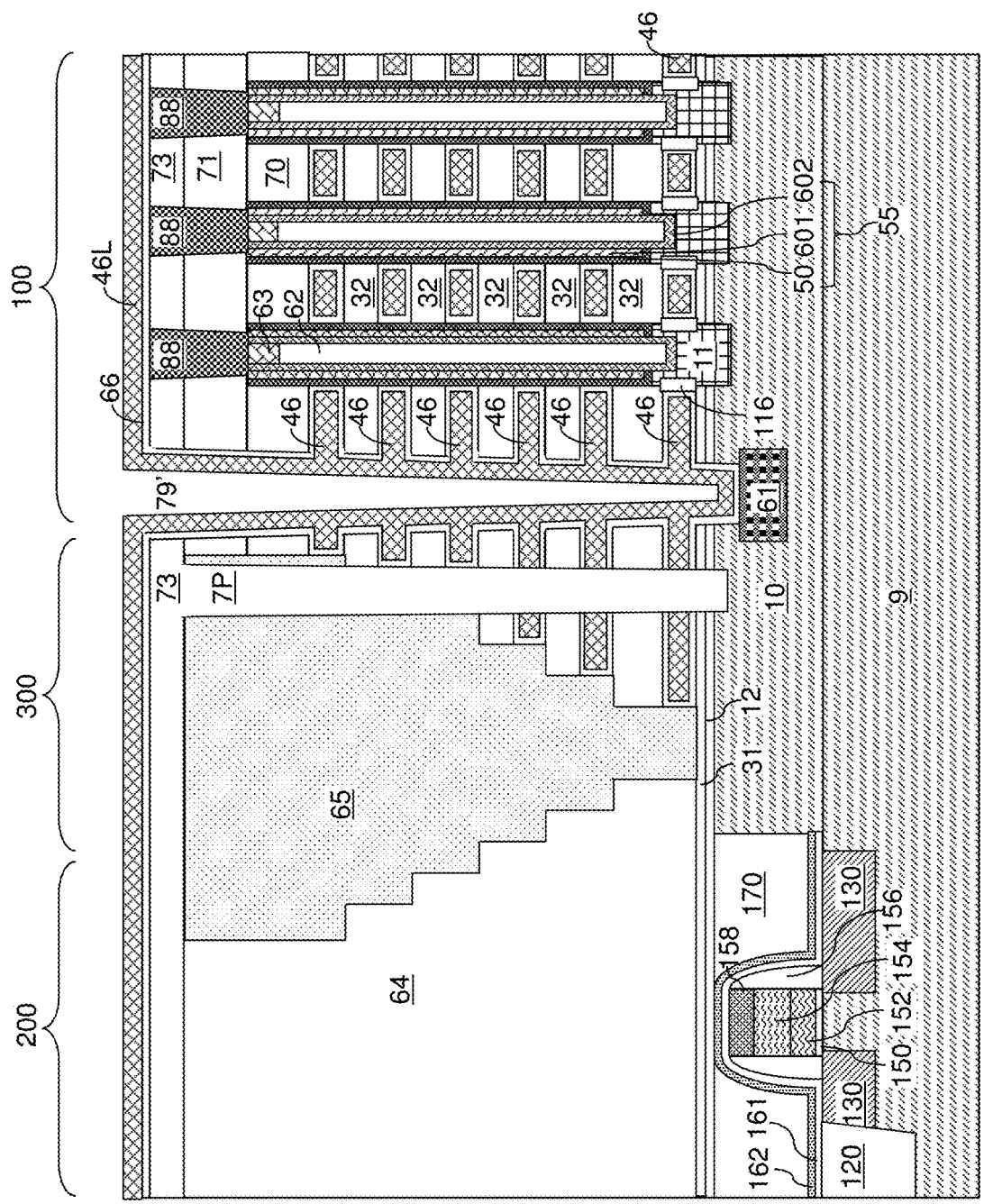
FIG. 14 is a vertical cross-sectional view of a second exemplary structure after formation of metallic electrically conductive lines according to a second embodiment of the present disclosure.

Referring to FIG. 14, a second exemplary structure according to a second embodiment of the present disclosure can be derived from the first exemplary structure of FIG. 7 by performing the processing steps of FIG. 10, i.e., by omitting the processing steps of FIGS. 8 and 9. In this case, the electrically conductive layers 46 are formed as metallic electrically conductive lines. In other words, the electrically conductive layers 46 consist of at least one metallic material, and do not include any semiconductor material. Each electrically conductive layer 46 can be a metallic material portion or a combination of at least two metallic material portions. Each electrically conductive layer 46 can contact the horizontal surfaces and a sidewall surface of a backside blocking dielectric layer 66, or can contact horizontal surfaces of insulating layers 32 and sidewalls of memory stack structures 55.

Figure 15:
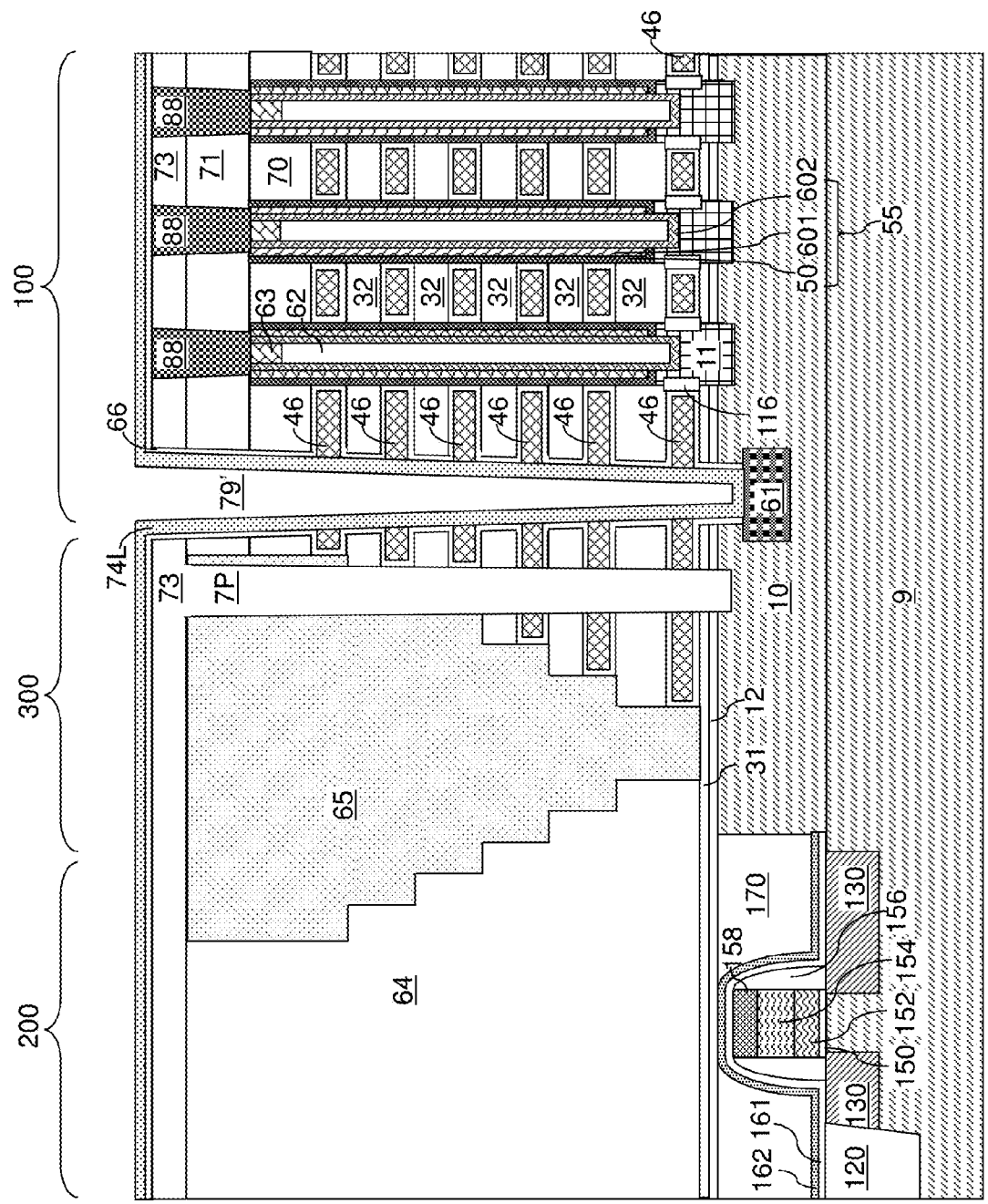
FIG. 15 is a vertical cross-sectional view of the second exemplary structure after formation of an insulating spacer according to the second embodiment of the present disclosure.

Referring to FIG. 15, the processing steps of FIG. 11 can be performed to remove the deposited metallic material of the contiguous metallic material layer 46L from the sidewalls of each backside contact trench 79 and from above the at least one array contact level dielectric layer (71, 73), for example, by an isotropic etch. Each electrically conductive layer 46 can function as a combination of a plurality of control gate electrodes located at a same level and a word line electrically interconnecting the plurality of control gate electrodes located at the same level in the same manner as in the first embodiment.

An insulating material layer 74L can be formed in the at least one backside contact trench 79 and over the at least one array contact level dielectric layer (71, 73) by a conformal deposition process as in the first embodiment. In one embodiment, the insulating material layer 74L comprises a dielectric metal oxide. In one embodiment, the dielectric metal oxide of the insulating material layer 74L can be selected from a dielectric oxide of at least one transition metal element, a dielectric oxide of at least one rare earth element, a dielectric oxynitride of at least one transition metal element, a dielectric oxynitride of at least one rare earth element, aluminum oxide, and combinations thereof. In one embodiment, the dielectric metal oxide of the insulating material layer 74L can comprise aluminum oxide.

In case a dielectric metal oxide is employed as the material of the insulating material layer 74L, the dielectric metal oxide can block vertical diffusion of any fluorine atoms that are collaterally incorporated into the electrically conductive layers 46 during deposition of the metallic material of the electrically conductive layers 46.

Figure 16:
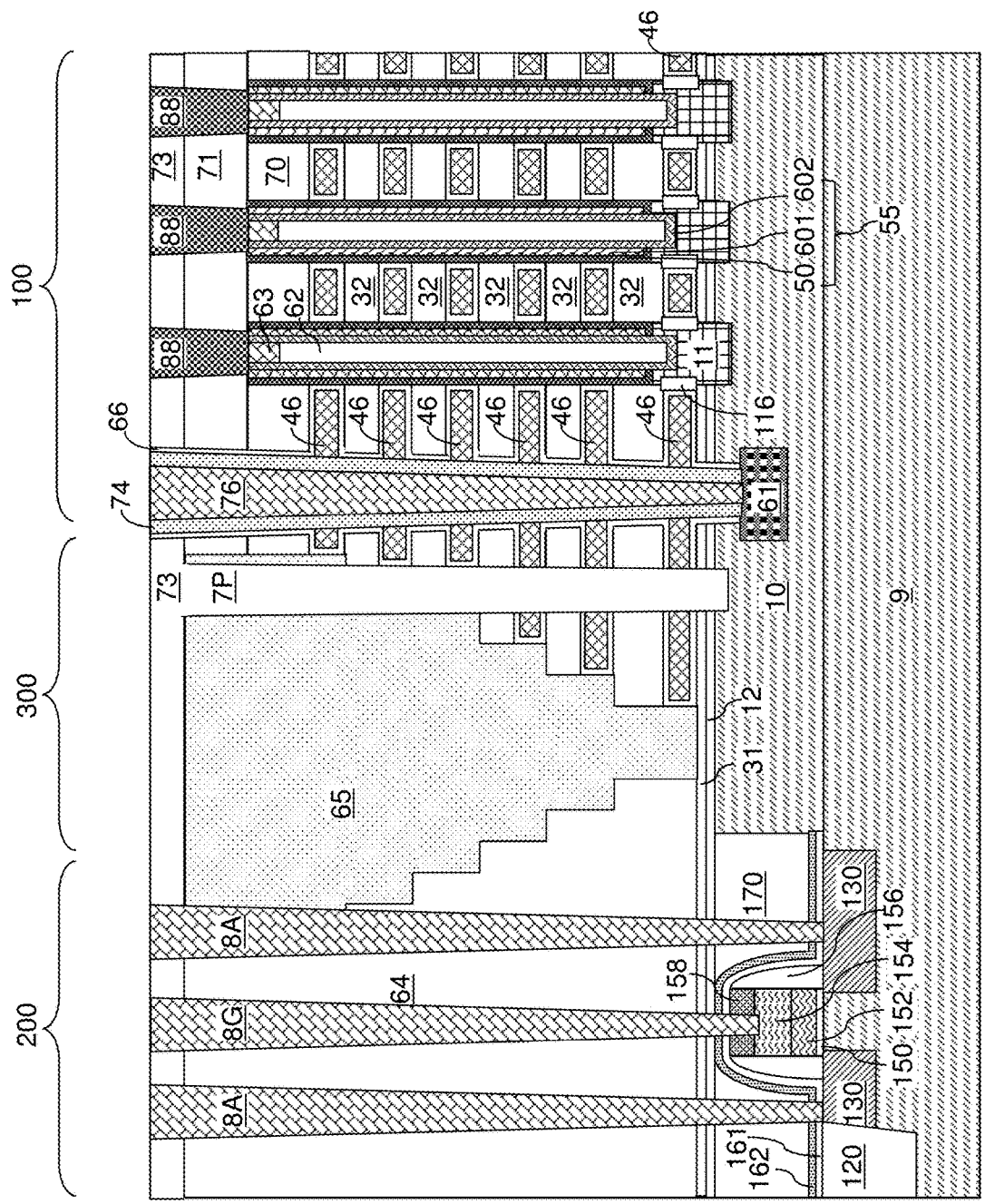
FIG. 16 is a vertical cross-sectional view of the second exemplary structure after formation of a backside contact via structure according to the second embodiment of the present disclosure.
Figure 17:
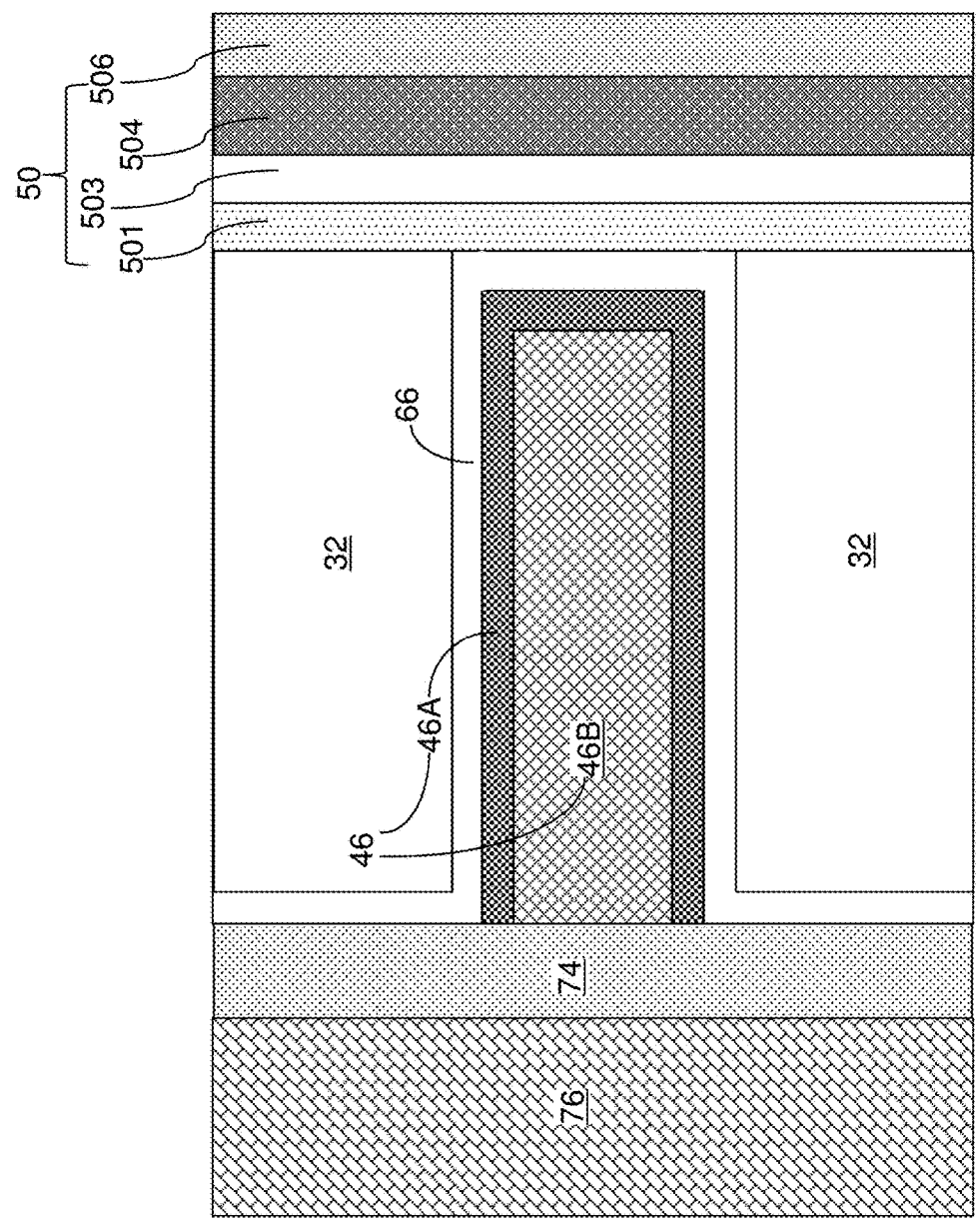
FIG. 17 is a magnified view of a region of the second exemplary structure of FIG. 16.

Referring to FIGS. 16 and 17, an anisotropic etch is performed to remove horizontal portions of the insulating material layer 74L. Each remaining portion of the insulating material layer 74L inside a backside contact trench 79 constitutes a vertically elongated annular structure with a vertical cavity therethrough, which is herein referred to as an insulating spacer 74. Each insulating spacer 74 can be formed over the sidewalls of the backside contact trench 79, and can be formed directly on substantially vertical sidewalls of the backside blocking dielectric layer 66 and directly on the sidewalls of the electrically conductive layers 46. The thickness of each insulating spacer 74, as measured at a bottom portion thereof, can be in a range from 1.5 nm to 60 nm, although lesser and greater thicknesses can also be employed. In one embodiment, the thickness of the insulating spacer 74 can be in a range from 3 nm to 10 nm. In one embodiment, each insulating spacer 74 can comprise a dielectric metal oxide such as aluminum oxide.

The modification in the second exemplary structure over the first exemplary structure is the substitution of electrically conductive layers 46 consisting of at least one metallic material in the second exemplary structure for the composite electrically conductive layers (44, 46) including a metallic material portion 46 and at least one doped semiconductor material portion 44 in the first exemplary structure. As such, the second exemplary structure can provide the same functions as the first exemplary structure.

In one embodiment, each of the first and second exemplary structures can include a monolithic three-dimensional memory device that comprises an insulating spacer 74 laterally surrounding a backside contact via structure 76 and comprising a dielectric metal oxide. In this case, the monolithic three-dimensional memory device can comprise a stack of alternating layers comprising insulating layers 32 and electrically conductive layers {(44, 46) or 46} and located over a substrate (9, 10), an array of memory openings extending through the stack; a plurality of memory stack structures 55 located within a respective memory opening; a backside contact via structure 76 extending through the stack; and an insulating spacer 74 laterally surrounding the backside contact via structure 76 and comprising a dielectric metal oxide.

In one embodiment, each of the plurality of memory stack structures 55 comprises a vertical stack of memory elements (as embodies as sections of a memory material layer 504 adjacent to an electrically conductive layers {(44, 46) or 46}, a tunneling dielectric layer 506, and a vertical semiconductor channel 60; and the backside contact via structure 76 contacts a top surface of a source region 61 located in, or on, the substrate (9, 10, 61).

The monolithic three-dimensional memory device can further comprise drain regions 63 located on a top portion of a respective memory stack structures 55. A semiconductor channel comprising a semiconductor material portion within the substrate (e.g., within the semiconductor material layer 10), a respective epitaxial channel portion 11, and a respective vertical semiconductor channel 60 contiguously extends between the source region 61 and each of the drain regions 63. In one embodiment, an annular bottom surface of the insulating spacer 74 contacts a top surface of the source region 61.

Dielectric degradation and electrical shorts due to fluorine radical generation from metallic electrically conductive lines in a three-dimensional memory device can be reduced by forming composite electrically conductive layers and/or use of a metal oxide material for an insulating spacer for backside contact trenches. Fluorine atoms can break silicon-oxygen bonds to form a volatile silicon-fluorine compound (such as $SiF_4$) to escape from a silicon oxide containing material portion. Also, fluorine atoms can break silicon-oxygen bonds to form a low dielectric constant SiOF material and easily breakdown. However, a dielectric metal oxide such as aluminum oxide can prevent outward diffusion of fluorine atoms or fluorine-containing molecules. Further, in the case of the first embodiment, the composite electrically conductive layers (44, 46) employ a lesser amount of metallic material than electrically conductive layers consisting of metallic materials. Given that semiconductor materials generally introduce less mechanical stress to surrounding elements, the composite electrically conductive layers (44, 46) of the present disclosure can provide reduced stress relative to equivalent structures employing only metallic materials for electrically conductive layers. Reduction of mechanical stress can facilitate alignment during subsequent lithographic steps, and can reduce overlay variations in subsequent measurement steps.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device comprising:
   a stack of alternating layers comprising insulating layers and electrically conductive layers and located over a substrate;
   a backside blocking dielectric layer;
   an array of memory openings extending through the stack; and
   a plurality of memory stack structures located within a respective memory opening, wherein:
   the electrically conductive layers comprise composite electrically conductive layers; and
   each composite electrically conductive layer comprises:
      a doped semiconductor material portion directly physically contacting a horizontal bottom surface of a respective overlying portion of the backside blocking dielectric layer, a horizontal top surface of a respective underlying portion of the backside blocking dielectric layer, and a sidewall surface of a respective vertical portion of the backside blocking dielectric layer;
      a metallic material portion electrically shorted to the doped semiconductor material portion and laterally spaced from a most proximal memory stack structure by at least the doped semiconductor material portion and directly physically contacting a horizontal bottom surface of a respective overlying portion of the backside blocking dielectric layer and a horizontal top surface of a respective underlying portion of the backside blocking dielectric layer; and
      a metal-semiconductor alloy portion directly physically contacting the doped semiconductor material portion, the metallic material portion, a horizontal bottom surface of a respective overlying portion of the backside blocking dielectric layer, and a horizontal top surface of a respective underlying portion of the backside blocking dielectric layer.

2. The monolithic three-dimensional memory device of claim 1, wherein the backside blocking dielectric layer comprises a dielectric metal oxide.

3. The monolithic three-dimensional memory device of claim 1, wherein a contiguous space extending between a neighboring pair of memory stack structures within a level of one of the electrically conductive layers excludes the metallic material portion.

4. The monolithic three-dimensional memory device of claim 1, wherein each metallic material portion comprises:
   a metallic liner portion comprising a conductive metallic compound of at least one elemental metal and a non-metallic element and contacting a respective doped semiconductor material portion; and
   a metal fill portion comprising at least one elemental metal and laterally spaced from the respective doped semiconductor material portion by the metallic liner portion.

5. The monolithic three-dimensional memory device of claim 1, wherein each of the plurality of memory stack structures comprises a vertical stack of memory elements, a tunneling dielectric layer, and a vertical semiconductor channel.

6. The monolithic three-dimensional memory device of claim 1, wherein:
- the monolithic three-dimensional memory device comprises a vertical NAND device located over the substrate;
- the electrically conductive layers comprise, or are electrically connected to, a respective word line of the vertical NAND device;
- the substrate comprises a silicon substrate;
- the vertical NAND device comprises an array of monolithic three-dimensional NAND strings located over the silicon substrate;
- at least one memory cell in a first device level of the array of monolithic three-dimensional NAND strings is located over another memory cell in a second device level of the array of monolithic three-dimensional NAND strings;
- the silicon substrate contains an integrated circuit comprising a driver circuit for the memory device located thereon;
- the array of monolithic three-dimensional NAND strings comprises:
  - a plurality of semiconductor channels, wherein at least one end portion of each of the plurality of semiconductor channels extends substantially perpendicular to a top surface of the substrate; and
  - a plurality of charge storage elements, each charge storage element located adjacent to a respective one of the plurality of semiconductor channels; and
- the composite electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level.

7. The monolithic three-dimensional memory device of claim 1, wherein the metal-semiconductor alloy portion comprises an alloy of a semiconductor material of the doped semiconductor material portion and an elemental metal or an intermetallic alloy of at least two elemental metals of the metallic material portion.

* * * * *